United States Patent

Akasaka et al.

[11] Patent Number: 5,572,430
[45] Date of Patent: Nov. 5, 1996

[54] METHOD AND APPARATUS FOR COOPERATED DESIGN

[75] Inventors: Shingo Akasaka, Zushi; Sugino Kazuhiro, Yokohama; Hiroko Imanishi, Yokohama; Junichi Saeki, Yokohama; Kunihiko Nishi, Tokyo-to, all of Japan

[73] Assignee: Hitachi, Ltd., Tokyo, Japan

[21] Appl. No.: 905,888

[22] Filed: Jun. 29, 1992

[30] Foreign Application Priority Data

Jul. 3, 1991 [JP] Japan ................................. 3-162929
Aug. 2, 1991 [JP] Japan ................................. 3-194185

[51] Int. Cl.⁶ ................................................ G06F 19/00
[52] U.S. Cl. ................................. 364/468.01; 364/188
[58] Field of Search ................................. 364/468, 490, 364/491, 150, 148, 149, 151, 401

[56] References Cited

U.S. PATENT DOCUMENTS

| | | | |
|---|---|---|---|
| 4,571,685 | 2/1986 | Kamoshida | 364/468 |
| 4,604,718 | 8/1986 | Norman et al. | 364/188 X |
| 4,975,827 | 12/1990 | Yonezawa | 364/153 X |
| 4,989,166 | 1/1991 | Akasaka et al. | |
| 5,034,897 | 7/1991 | Sainen | 364/156 X |
| 5,109,337 | 4/1992 | Ferriter et al. | 364/401 |
| 5,229,948 | 7/1993 | Wei et al. | 364/402 X |
| 5,287,284 | 2/1994 | Sugino et al. | 364/468 |
| 5,406,476 | 4/1995 | Deziel, Jr. et al. | 364/401 X |

FOREIGN PATENT DOCUMENTS 2-48774  2/1990  Japan .

OTHER PUBLICATIONS

*Die Technologies,* Edition No. 11, vol. 2, Chapter 2, published by Nikkan Kogyo Newspaper Company, Oct. 20, 1987, pp. 16–19. (Japanese).

Sugino, Kazuhiro, et al., "A System with Model Formulation Capabilities for Fluid Flow Analysis of Plastic Molds," The International Conference on Manufacturing Systems and Environment, The Japan Society of Mechanical Engineers, Tokyo, Japan, May 28–Jun. 1, 1990, pp. 1–6. (English).

Saeki, Junichi, et al. "Flow Analysis of an Epoxy Compound for Low–Pressure Transfer Molding in a Circular Cross–Sectional Channel," JSME International Journal, Series II, vol. 33, No. 3, 1990, pp. 486–493. (English).

Kitano, Makoto, et al. "Analysis of Package Cracking During Reflow Soldering Process," Proceedings of the 26th International Reliability Physics Symposium, IEEE/IRPS, 1988, pp. 90–95. (English).

*Primary Examiner*—Roy N. Envall, Jr.
*Assistant Examiner*—Brian C. Oakes

[57] ABSTRACT

In order to derive optimum design specifications based on total evaluation performed on a product as a whole instead of individual design items during a process of determining design specifications involving a plurality of design items, candidates for the product specifications are selected by controlling design parameters for each of the design items in an integrated manner, computing values of a plurality of evaluation items evaluating candidates for the design specifications and performing total evaluation on all the evaluation items based on their computed values through collaboration among a plurality of design sections altogether auto-correcting all relevant design parameters quickly and relaxing as well as reassessing design constraints for a design parameter.

9 Claims, 24 Drawing Sheets

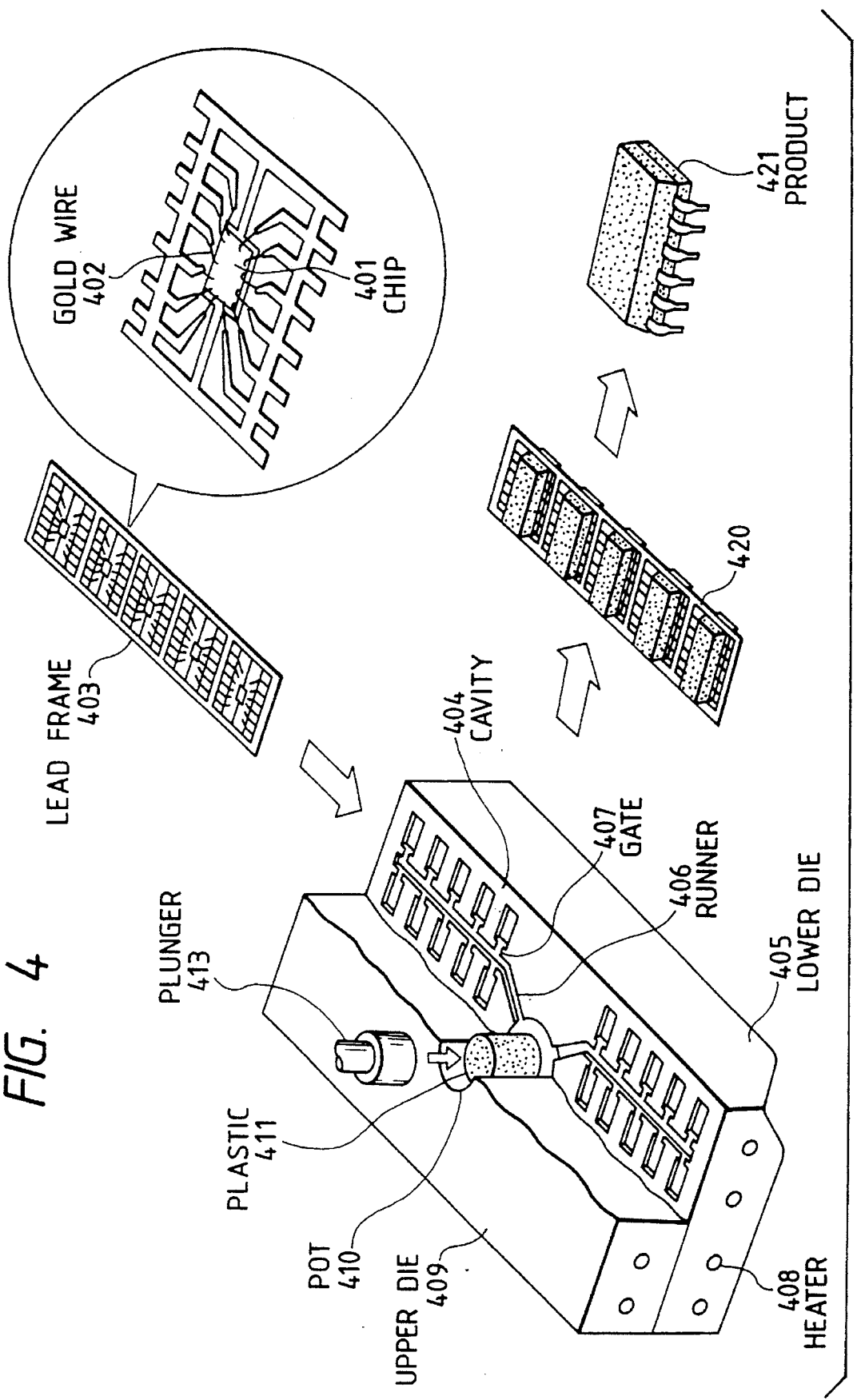

MOLD DIE 54

51 PACKAGE STRUCTURE

52 CHIP

53 FRAME

GOLD WIRE 253

CHIP 251

252 FRAME

255 MOLD DIE

254 PACKAGE STRUCTURE

FIG. 10

DESIGN-PARAMETER DATA 1010

| CODE | DESIGN-PARAMETER NAME | NAME OF DESIGN SECTION HAVING THE RIGHTS OF DECISION | TRADE-OFF RELATION BETWEEN EVALUATION ITEMS | EVALUATION PROGRAM | | | | | VALUE |
|---|---|---|---|---|---|---|---|---|---|
| | | | | $f_1$ | $f_2$ | $f_3$ | $f_4$ | | |
| P1 | PACKAGE WIDTH | STRUCTURE DESIGN | | | | | | | |
| P2 | PACKAGE LENGTH | STRUCTURE DESIGN | | | | | | | |
| P3 | PACKAGE HEIGHT | STRUCTURE DESIGN | | | | | | | |
| P4 | CHIP WIDTH | CIRCUIT DESIGN | | | | | | | |
| P5 | CHIP LENGTH | CIRCUIT DESIGN | | | | | | | |
| P6 | CHIP HEIGHT | CIRCUIT DESIGN | | | | | | | |
| P7 | DIMENSION BENEATH CHIP PAD | STRUCTURE DESIGN AND DIE DESIGN | $f_1, f_2$ | | | | | | |
| P8 | FRAME THICKNESS | FRAME DESIGN | | | | | | | |
| P9 | FRAME MATERIAL QUALITY | FRAME DESIGN | | | | | | | |
| P10 | DIE EXTERNAL DIMENSIONS | DIE DESIGN | | | | | | | |
| P11 | MOLDING CONDITION | DIE DESIGN | | | | | | | |
| P12 | PRODUCT TEST CONDITION | STRUCTURE DESIGN | | | | | | | |
| P13 | RESIN QUALITY | STRUCTURE DESIGN | | | | | | | |
| P14 | FRAME EXTERNAL DIMENSIONS | FRAME DESIGN | | | | | | | |
| P15 | FRAME-SIDE BONDING COORDINATES | FRAME DESIGN | | | | | | | |
| P16 | CHIP-SIDE BONDING COORDINATES | CIRCUIT DESIGN | $f_3, f_4$ | | | | | | |
| P17 | CHIP INTERNAL WIRING COORDINATES | CIRCUIT DESIGN | | | | | | | |
| P18 | WIRE DIAMETER | FRAME DESIGN | | | | | | | |
| P19 | WIRE LOOP HEIGHT | FRAME DESIGN | | | | | | | |
| P20 | WIRE QUALITY | FRAME DESIGN | | | | | | | |

FIG. 11

ANALYSIS PROGRAM 1101

| CODE | PROGRAM NAME | DESIGN PARAMETERS (ARGUMENTS) REQUIRED FOR EXECUTION |
|---|---|---|
| $f_1$ | STRESS-ANALYSIS PROGRAM | P1, P3, P4, P6, P7, P8, P9, P12, P13 |
| $f_2$ | RESIN-FLOW ANALYSIS PROGRAM IN CAVITY | P1, P2, P3, P4, P5, P6, P7, P8, P10, P11, P13 |
| $f_3$ | CHIP WIRE-LENGTH EVALUATION PROGRAM | P16, P17 P4, P5, P6 |
| $f_4$ | ANALYSIS PROGRAM FOR WIRE-DEFORMATION IN CAVITY | P1, P2, P3, P4, P5, P6, P7, P10, P11, P13, P15, P16, P18, P19, P20 |
| ... | ... | ... |

FIG. 24

DESIGN PARAMETERS

| CODE | DESCRIPTION | VALUE |
|---|---|---|
| P1 | PACKAGE HEIGHT | 2.7 |
| P2 | FRAME POSITION | 1.3 |
| P3 | DISTANCE FROM PACKAGE BOTTOM-SURFACE TO FRAME BOTTOM-SURFACE | : |
| P4 | FRAME THICKNESS | : |
| P5 | CHIP THICKNESS | : |
| P6 | DISTANCE FROM PACKAGE TOP-SURFACE TO FRAME TOP-SURFACE | : |
| P7 | FRAME LOWERING WIDTH | : |
| P8 | WIRE HEIGHT | : |
| P9 | DISTANCE FROM PACKAGE TOP-SURFACE TO WIRE | : |
| P10 | PLASTIC QUALITY | : |
| P11 | FRAME QUALITY | : |
| P12 | CHIP QUALITY | : |
| P13 | THERMAL STRESS PREDICTED VALUE | : |
| P14 | DIE PARAMETER 1 | : |
| : | : | : |

FIG. 25

CONSTRAINT CONDITIONS

| CODE | CONSTRAINT CONDITION | NAME OF EXPERI-MENTAL DATA |
|---|---|---|
| P3 | $P3 > a_1$ | $d_1$ |
| P4 | $P4 > a_2$ | $d_2$ |
| P5 | $P5 > a_3$ | $d_3$ |
| P6 | $P6 > a_4$ | $d_4$ |
| P7 | $P7 < a_5$ | $d_5$ |
| P8 | $a_6 < P8 < a_7$ | $d_6$ |
| P9 | $P9 > a_8$ | $d_7$ |
| P13 | $P13 < a_9$ | $d_8$ |
| P15 | ⋮ | ⋮ |
| ⋮ | | |

PROGRAMES

| CODE | DESCRIPTION | INPUT PARAMETERS | OUTPUT PARAMETERS |
|---|---|---|---|
| $f_1$ | WIRE-HEIGHT CALCULATION | P2, P3, P5 | P8 |
| $f_2$ | STRESS ANALYSIS | : | P13 |
| $f_3$ | P9 COMPUTATION | P1, P3, P4, P5, P8 | P9 |
| $f_4$ | ANALYSIS OF PLASTIC FLOW IN CAVITY | P3, P6, P14<br>P14 ··· | P15 |
| $f_5$ | FRAME-DEFORMATION ANALYSIS | P15, P11, P4 | P16 |
| : | : | : | : |

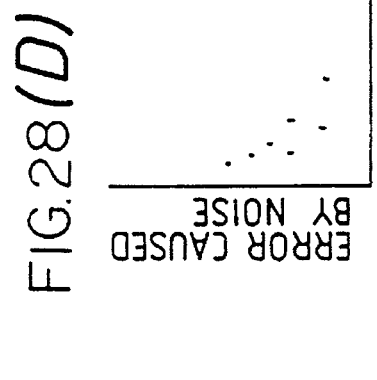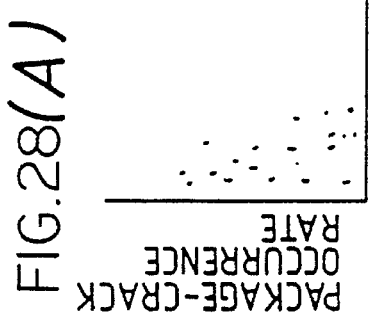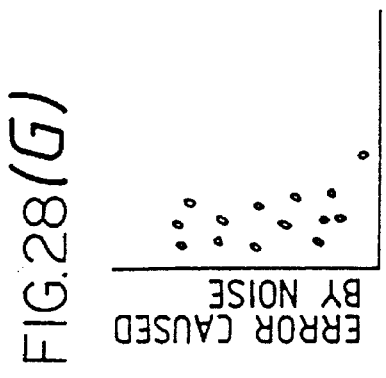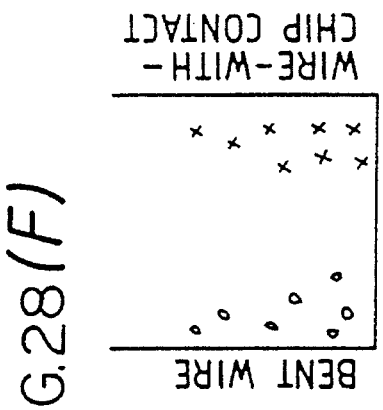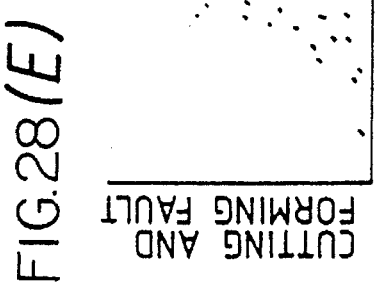

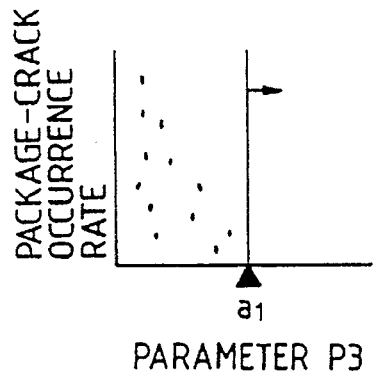
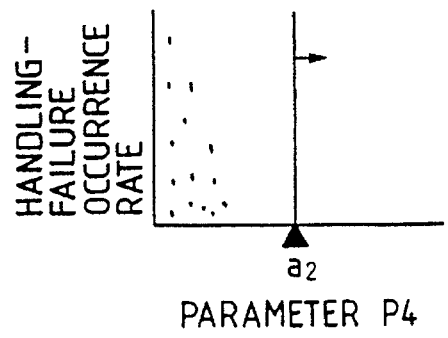
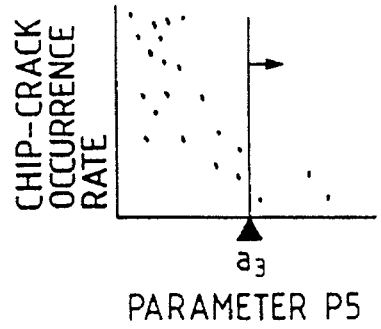
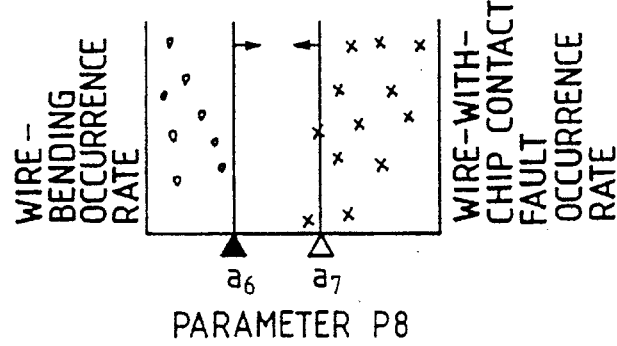
FIG.29

METHOD AND APPARATUS FOR COOPERATED DESIGN

BACKGROUND OF THE INVENTION

The present invention relates to a design cooperation system for items of design for use in design as viewed from a plurality of standpoints such as desired reliability, producibility and operatability and for determining product specifications. In particular, the present invention relates to a method and system for cooperated design for obtaining optimum design values as viewed from overall standpoints by evaluating a plurality of design items as viewed from the overall standpoints and supporting collaboration work among sections designing the design items.

So far, a number of analysis techniques and systems for evaluating and determining design specifications of a product have been announced.

A representative example of such analysis techniques and systems is an analysis and evaluation technique and system for performing flow and cooling analyses in the design of a molding die. This analysis and evaluation technique and system are discussed on pages 16 to 19 of Chapter 2, Edition No. 11, Volume 2 of "Die Technologies" published by Nikkan Kogyo Newspaper Company on Oct. 20, 1987. According to this representative example of the conventional technologies, in a typical conventional technology, in order to design a die, it is necessary to carry out, among other analyses, flow, thermal-stress and structure analyses one after another in accordance with the molding process and then to verify design specifications individually by utilizing results of the analyses. In this case, the example is a tool for building a product. Accordingly, specifications of the product naturally have to be derived from combined results of both an analysis of product specifications performed by another design section and an analysis of die specifications carried out by the die-design section. In the conventional technology, however, there is no system that can be used to make an overall decision based on fusion of results of analyses performed in a variety of design aspects by a plurality of design sections.

Points listed below are not taken into consideration by the conventional technology described above. Accordingly, the conventional technology cannot be used for performing total evaluation viewed from a plurality of different standpoints on design specifications of a product which undergoes a design process involving a plurality of design items.

(1) The conventional technology cannot be used for carrying out total evaluation based on relations among results of specific analyses for a plurality of evaluation items. Note that the analyses can be done accurately and by merely displaying their results as graphics, their relations can be observed for evaluation.

(2) When a section in charge of certain design items kicks off design activities, at an early design step, design parameters or input data are not all gathered due to a lack of uniformity in design progress among design sections which is, in some cases, caused by other design sections not starting design work yet. The uncomplete design parameters do not allow analyses to be done. Accordingly, with the conventional technique, if interdependent design activities are not carried forward until all design parameters required for analyses are gathered, neither evaluation nor analyses can be performed, resulting in a slip in the design schedule. In some cases, results of an analysis based on design parameters set under conditions desirable for preceding design items or based on design parameters set temporarily must be collated with results of another analysis based on design parameters set by a succeeding design section in order to carry out evaluation. As a result, there is normally a lack of consistency of data for ordinary evaluation.

(3) The conventional technique makes use of an analysis program which utilizes only design parameters determined by a preceding design section. In this case, an attempt is made to perform optimization based only on the design parameters which determine results. Accordingly, design margins on design parameters used in a succeeding design section hardly exist or evaluation results of succeeding design items are very likely to be inadequate or to exceed a desirable limit.

In addition, in the past, a large number of data management policies of a CAD system were announced as a method for managing design data of a product. As is disclosed in Japanese Patent Laid-open No. 2-4153, for example, design data for a product and related information required for design and manufacturing are systematically administered and three-dimensional data for FEM (Finite Element method), numerical control, analyses and other purposes is treated by relating it to its design object. In addition, in a technique disclosed in Japanese Patent laid-open No. 2-48774, information on correction such as a flag to indicate correctability and the names of correctors is added to design data for each part unit as part of the administration of the design data. In this way, design work can be carried out by a plurality of designers concurrently designing a product by sharing part data.

In the conventional techniques cited above, however, points described below are not taken into consideration. Accordingly, the techniques cannot cope easily with changes in specification resulting from study of specifications conducted by a plurality of design sections which frequently repeat the work of prototyping a product. The points not taken into consideration include the fact that in design parameters, design constraints set by estimating certain safety factors or design margins do exist. The work of setting the design constraints is based on tests and prior manufacturing experience and knowhow. Each constraint is set by a design section having the duty of determining parameter values associated with the constraint. Total evaluation from a plurality of points of view such as reliability and producibility is carried out at the prototyping stage of the product. From results of the total evaluation, an attempt may be made to change a specific design parameter. In this case, it is necessary to also modify other related design parameters which are in the domains of other design sections. If a modified design parameter exceeds its constraint value, the judgement of its merits and demerits or the possibility of eliminating its margins is left to the other section having the duty of determining the design-parameter value. When conducting a study of specifications for a plurality of design parameters, it is thus necessary for a plurality of design sections to scramble for the aforementioned margins by utilizing base data for setting the constraints.

In the conventional techniques described above, conditions of constraints mentioned above and the constraint setting base data associated with design parameters of a product are not controlled. In addition, a means for supporting the study of constraint relaxation or margin elimination is not provided either. Accordingly, the conventional techniques cannot cope with a study of specifications involving a plurality of design sections. Moreover, effects of modifying a design parameter on other design parameters in the domains of other design sections cannot be identified. As a result, the fact that a plurality of design sections or designers cannot conduct a study of specifications for a product at the same time is an undenyable reality.

SUMMARY OF THE INVENTION

It is a first object of the present invention to solve the shortcomings of the conventional techniques described above by providing a method for coordinated design for performing:

total evaluation and evaluation including manufacturing-cost estimation which judge a product to be optimum when all related design items are taken into consideration, being not limited to the capability of judging the product to be optimum when considering design items individually;

analyses, including planting design specifications as well as evaluation of candidates, and evaluation for deriving design specifications; and such analyses and evaluation at an early stage without regards to the progress of the design work.

It is a second object of the present invention to provide the above method for coordinated design with a facility for procuring appropriate values from related design sections or the same objects when undetermined input parameters exist at the execution of an evaluation/analysis program for a preceding design items in a design process. Furthermore, it is another object of the present invention to provide an apparatus for supporting the coordinated design cited above which allows the above method for coordinated design to be executed via a plurality of workstations distributed among design sections having the duty of determining parameter values for each of design items even if the design sections are located at remote locations.

In order to achieve the objects described above, the present invention provides a system for determining design specifications of a product to undergo a design process involving a plurality of design items which system is characterized in that:

design parameters for defining candidates for product specifications for each of the design items are input;

design parameters for each of the design items are controlled in an integrated manner;

values of a plurality of evaluation requirements for evaluating the candidates for the product specifications based on the design parameters are set;

total evaluation of each of the evaluation requirements based on their values is carried out; and candidates for the above product specifications are determined.

Furthermore, the system determines whether or not design parameters required for the execution of the analysis program described above have been set. If unset design parameters exist, the system can temporarily set such design parameters. If the design parameters needed in the execution of the analysis program include ones that require that specifications be collated with each other among the design items, or require trade off among each other, a plurality of design parameters are produced with their values changed in a number of ways. Variations in analysis result accompanying changes in design parameter are thereby found so as to allow final design parameters to be determined.

The configuration of the system for executing the above operations comprises an input unit for inputting design parameters defining candidates for product specifications for each of a plurality of design items, a parameter management unit for managing design parameters for each of the design items in an integrated manner, an analysis unit for setting values of a plurality of evaluation requirements and evaluating candidates for the product specifications in conjunction with the parameter management unit, a total-evaluation unit including a trade-off evaluation unit for determining candidates for the product specifications by totally evaluating trade-offs among the evaluation requirements based on the values of the evaluation requirements and an output unit including a display unit for outputting results of the determination. The system can also be implemented as a LAN configuration, an OA system made up of a communication network, a remote-communication system configuration or a configuration described as follows.

Each design item is connected to a workstation through a communication-control means. Workstations are connected to each other by buses which are connected to at least a central workstation. Each workstation associated with a design item comprises at least a data input unit, a design-parameter management unit and an analysis unit which are described earlier. The central workstation includes at least a total-evaluation unit.

In order to achieve the above objects, the present invention provides the following effective functions.

Each design-parameter management unit administers all design parameters associated with a design item of a product in an integrated manner. Each design-parameter management unit has functions for setting and modifying the values of the design parameters, verifying their presence and obtaining information on their properties such as the names of design sections having the duty of determining parameter values and whether or not judgement from a plurality of evaluation points of view is necessary.

An analysis-program registration unit is used for storing a group of analysis programs and information on input data required for the execution of the analysis programs. The analysis-program registration unit loads an analysis program, when necessary, and creates an environment allowing the loaded analysis program to be executed.

Each analysis unit is provided with the following three functions:

(1) Function requesting temporary setting of design parameters

When a design parameter required for analysis-program execution is not determined yet, an inquiry about the name of a design section having the duty of determining the value of the design parameter value and the object name is sent to the design-parameter administration unit. The execution is suspended until the value of the design parameter is received.

(2) Execution repeating function

When it is necessary to find trade-off relations among required design parameters, a plurality of input-data items are prepared for changing the values of the design parameters in a plurality of ways. The analysis program is then executed repeatedly as many times as the input-data items while changing the value of the input data.

(3) Automatic computation function

When a design parameter required for the execution of an analysis program is set or modified, the associated analysis program is found from a table of relation between design-parameter names and analysis-program names, and then executed automatically.

A trade-off evaluation unit calculates the value of a design parameter that maximizes the value of an evaluation formula stored internally on a trial-and-error basis by utilizing an analysis result of a trade-off relation for each evaluation item. In this way, the trade-off evaluation unit finds an optimum value of a design parameter that requires collation among computation items or evaluation items.

A result display unit is used for showing a graph, which depicts changes in evaluation value with changes in design parameter as computed by the trade-off evaluation unit, and for displaying the optimum value of the design parameter.

The functions described above allow a specification draft or specification candidates to be quickly evaluated without regard to the progress of the design work. It should be noted that such a specification draft or specification candidates may not be optimum when viewed from each individual design section. However, the specification draft or specification candidates are derived from design specifications that are optimum as viewed from all design sections. Accordingly, the functions allow an optimum design solution to be found eventually.

The design-parameter administration unit described above is further equipped with a function for temporarily setting a design parameter by searching, among other things, previously field-proven data cataloged in advance for a most appropriate value with a group of read design parameters used as a key.

Furthermore, the design-parameter administration unit also has a function for estimating a production cost if necessary. When the trade-off evaluation unit dealing with a relation among design parameters evaluates a trade-off relation among design sections or among evaluation items, the production-cost estimate function can then be used for calculating the cost as a clear evaluation indicator, allowing an optimum design solution to be found with ease.

Next, a hardware configuration is described. The hardware comprises a bus, a bus controller, a central processing unit, a disk controller, a main storage unit, a display unit, a keyboard and a disk. In addition, the numerous workstations which each include a communication controller and a modem can be connected to each other through the modems to form a LAN configurations. In this case, each workstation operates to perform jobs associated with a design section or an object. One of the workstations is used as their server. A workstation corresponding to each design section invokes an analysis program that is associated with received design parameters. When design parameters required for the execution of the analysis program are not all gathered, another workstation, that is associated with a design section having the duty of determining the value of the missing design parameter or the workstation of the object, is requested to temporarily set the design parameter. If the requested workstation is the server workstation, it evaluates the trade-off relation among design sections, objects or evaluation items by utilizing its trade-off evaluation unit. Results of the evaluation are then transmitted to the workstations of the requesting design sections or the like. Receiving the results, the workstations of the design sections store them into their main storage units and then output them to the display apparatuses of their result display units for visual verification.

It is a third object of the present invention to provide a solution to the shortcomings of the above conventional techniques by providing a method for managing cooperated design that quickly determines specifications at a product prototyping stage by automatically correcting all design parameters effected by modification of a local design parameter at an individual design section and quickly identifying its side effects, and carrying out collaborated relaxation and reassessment of design constraints among a plurality of design sections in case no design solution within the design constraints is found.

It is a fourth object of the present invention to provide an apparatus for managing cooperated design that is well suitable for implementing the method for managing cooperated design.

It is a fifth object of the present invention to provide a network system for managing cooperated design that is well suitable for implementing the method for managing cooperated design even for design sections located at sites geographically remoted from each other.

The third object of the present invention is achieved through collaborated auto-correction of all design parameters at a plurality of design sections affected by modification of a local design parameter at an individual design section by means of a method for managing cooperated design which comprises:

a first step of inputting design parameters of a product-specification draft including at least external dimensions, materials and manufacturing conditions to be input for each design section with constraint conditions for each design parameter related to the product as well as set base data such as empirical data for the constraint conditions, rules governing relations among design parameters and a set of programs necessary for evaluation of the design parameters registered in advance;

a second step of automatically correcting or setting all design parameters affected by the updating of a design parameter or the introduction of a new design parameter;

a third step of judging whether or not the values of the automatically corrected design parameters meet the constraint conditions;

a fourth step of computing and displaying a difference between the value of a design parameter and a constraint value in the case of detected constraint violation or contradiction by the design parameter;

a fifth step of requesting the user to correct the entered value of the design parameter or to modify the constraint conditions in the case of the detected constraint violation or contradiction by the design parameter;

a sixth step of creating a list of constraint conditions related to the design parameter violating or contradicting the constraints along with the set base data of the conditions and displaying the list to the user in the case of the alternative selected by the user to modify the constraint values; and a seventh step of re-cataloging the displayed constraint conditions after being corrected interactively.

The fourth object of the present invention can be achieved by equipping the apparatus for managing cooperated design with:

data input means for inputting design parameters of a product-specification draft including at least external dimensions, materials and manufacturing conditions to be input for each design section;

design-parameter management means for managing all design parameters pertaining to a product in an integrated manner;

design-constraint registration means for registering in advance existing constraint conditions along with set base data for the conditions for each design parameter;

program registration means for registering rules of relation among design parameters or programs necessary for computing evaluation-function values of design parameters;

design-consistency management means comprising a function for automatically correcting all design parameters affected by modification of a design parameter by loading and invoking a relevant program from the program registration means and a function for checking whether or not the automatically corrected values are within constraint ranges registered in design-constraint registration means; and constraint relaxation and arrangement means comprising a function for listing and displaying constraints in the design-constraint registration means related with design parameters in question along with set base data and a function for allowing the displayed constraint conditions to be corrected interactively and recataloging the corrected constraint conditions into the design-constraint registration means, The fifth object can be achieved by using workstations which are located at remote sites in a distributed system and each serve as an apparatus for managing cooperated design. The workstations are connected to each other to form a network,

BRIEF DESCRIPTION OF THE DRAWINGS

FIG. 4 is a diagram showing the conventional process flow;

FIG. 10 is a diagram showing the structure of data stored in a data base provided by the present invention;

FIG. 11 is a diagram showing the structure of data stored in a data base provided by the present invention;

FIG. 24 is a diagram showing typical data in a disk controlled a design-parameter management unit;

FIG. 25 is a diagram showing typical data in the disk controlled by a design-constraint registration unit;

FIG. 28(A), (b), (C), (D), (E), (F), (G) are diagrams showing empirical data that serve as the bases for constraint conditions; and FIG. 29 is a diagram showing a typical displayed list of candidates for constraint relaxations.

DESCRIPTION OF THE PREFERRED EMBODIMENTS

Figure 1:
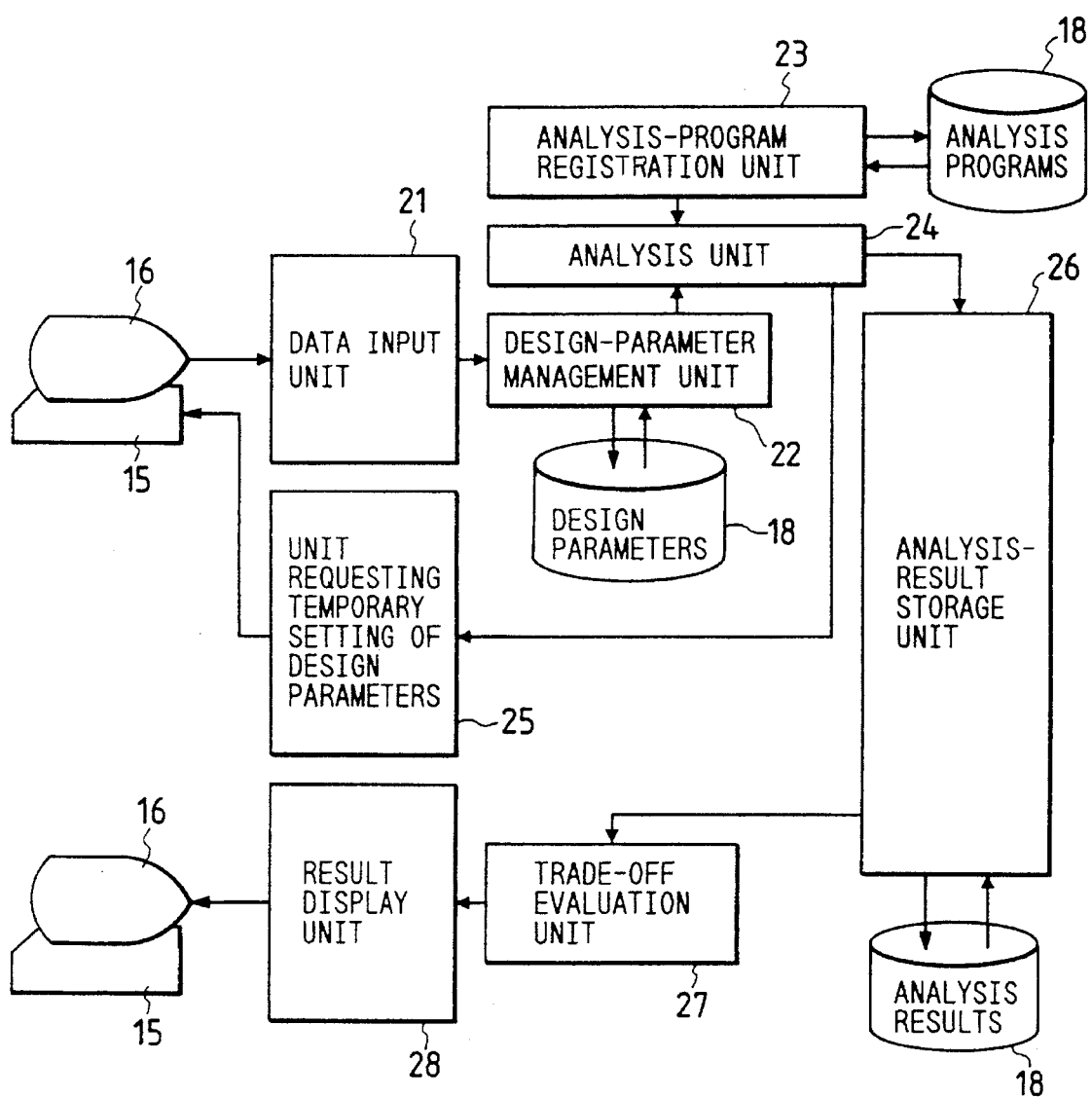
FIG. 1 is a configuration diagram of software used in a system for cooperated design provided by the present invention.
Figure 2:
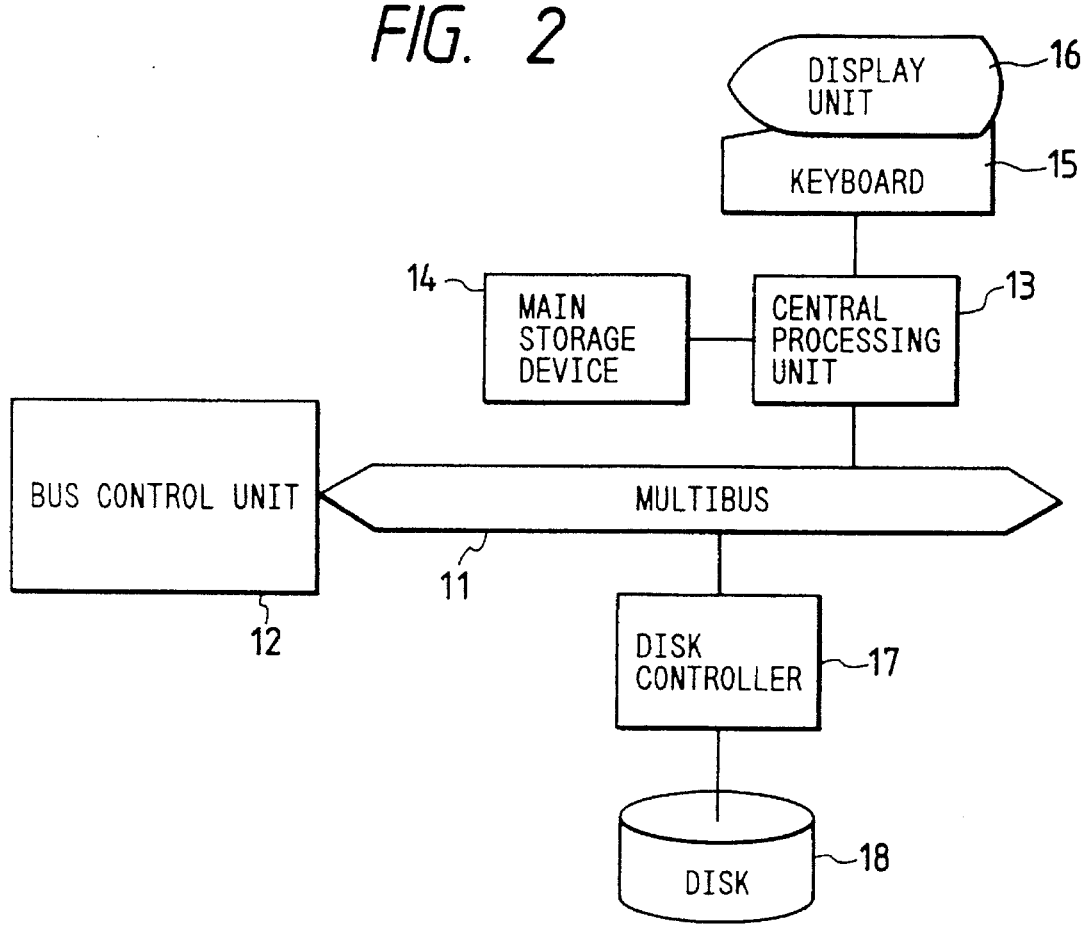
FIG. 2 is a diagram showing a hardware configuration of the present invention.

Referring to diagrams, the present invention is described in detail as follows. FIGS. 2 and 1 are diagrams showing respectively a typical hardware configuration of a system for cooperated design and a functional configuration of its software. As shown in FIG. 2, a multibus 11 which is controlled by a bus controller 12 is connected to a central processing unit 13 in addition to a disk drive 18 controlled by a disk controller 17. The central processing unit 13 is further connected to a main storage device 14, a display unit 16 and a keyboard 15. In this hardware configuration, data entered via the keyboard 15 is stored into the main storage device 14 by the central processing unit 13 and, at the same time, output to a display unit 16. Data stored in the main storage device 14 is transferred to the disk controller 17 through the multibus 11 to be stored in the disk drive 18.

As shown in FIG. 1, the functional configuration of the software provided by the present invention comprises, among other units (functions), a data input unit (function) 21, a design-parameter management unit (function) 22, an analysis-program registration unit (function) 23, an analysis unit (function) 24, a unit (function) requesting temporary parameter setting 25, an analysis-result storage unit (function) 26, a trade-off evaluation unit (function) 27 and a result display unit (function) 28.

Functions of the units described above are described in actual terms as follows. The data input unit 21 inputs design parameters associated with a partial specification draft or specification candidates including external dimensions and materials of a product, and the names of evaluation items for the design task of each design section or each design item which are inputted at each design section.

The design-parameter management unit 22 controls all design parameters of a product input by the data input unit 21 of each design section in an integrated manner, performing tasks for setting as well as modifying their values, verifying their presence and identifying their attributes such as the names of design sections having the duty of determining parameter values, the names of objects equipped with facilities required for the design work and blocks and flags indicating whether or not it is necessary to consider decisions based on a plurality of evaluation points of view. The present invention provides an expert system not only for supporting cooperated design among design sections in a production plant, but also for making cooperated operations among objects of the expert system and cooperation among other functional blocks possible.

The analysis-program registration unit 23 stores a collection of analysis programs associated with each evaluation item which corresponds to the design work for each design section. It also stores input data including the names of design parameters required for the execution of the analysis programs. When necessary, the analysis-program unit 23 also invokes one of the programs and create an environment for executing the program.

The analysis unit 24 comprises the following three functions:

(1) Function requesting temporary setting of design parameters

Let an analysis program corresponding to an evaluation item input by the data input unit 21 be invoked by the analysis-program registration unit 23 and about to be executed by using design parameters set in the design-parameter management unit 22 as input values. At that time, if a design parameter required for the execution of the analysis-program is not determined yet, an inquiry about the name of a design section having the duty of determining the value of the design parameter and the name of an object having the corresponding function is sent to the design-parameter management unit 22. The execution of the analysis program is suspended until the value of the undetermined design parameter is received from the data input unit 21 or the relevant design section.

(2) Execution repeating function

Let an analysis program be about to be executed as in the case described above. At that time, if design parameters required for the execution of the analysis program include that recorded in the design-parameter management unit 22 as a parameter requiring trade-off consideration, a plurality of input-data items are prepared for changing the value of the design parameter in question in a plurality of ways. The analysis program is then executed repeatedly as many times as the input-data items while changing the value of the input data. Note that the above trade-off configuration is regarded as necessary typically due to the fact a plurality of relevant design sections or blocks exist or collation with a result output by another analysis program is regarded as necessary.

(3) Automatic computation function

When an undetermined design parameter identified by the function (1) described above is set by the other design section or block, or a design parameter registered in the design-parameter management unit 22 is modified, the associated analysis program is found from a table in the analysis-program registration unit 23 defining relation between design-parameter names and analysis-program names, and then executed automatically.

The analysis-result storage unit 26 stores an analysis result produced by the analysis unit 24 in the event of a change in design parameter for each evaluation item. It also controls such analysis results so that they can be fetched with ease for use in total evaluation.

The trade-off evaluation unit 27 computes the value of a design parameter that maximizes the value of an evaluation formula stored therein on a trial-and-error basis by making use of trade-off related analysis results for each evaluation item administered by the analysis-result storage unit 26. In other words, the trade-off evaluation unit 27 finds the optimum value of a design parameter that requires collation among design sections, blocks or evaluation items.

The result display unit 28 displays a curve representing changes in evaluation-formula value with changes in design parameter found by the trade-off evaluation unit 27 and the optimum value of the design parameter at the same time.

The operations of the data input unit 21, the design-parameter management unit 22, the analysis-program registration unit 23, the analysis unit 24, the analysis-result storage unit 26, the trade-off evaluation unit 27 and the result display unit 28 described above allow a specification draft or specification candidates to be quickly evaluated without regard to the progress of the design work. It should be noted that such a specification draft or specification candidates may not be optimum when viewed from each individual design section. However, the specification draft or specification candidates are derived from design specifications that are optimum as viewed from all design sections. Accordingly, the functions of the above units allow a final optimum design solution to be found.

The design-parameter management unit 22 described above is further equipped with a function for temporarily setting a design parameter. When a relevant design section or block requests that the value of a design parameter required in the inovacation of an analysis program be set temporarily through the function for requesting temporary setting of design parameters of the analysis unit 24 described previously, the function for temporarily setting a design parameter of the design-parameter management unit 22 works as follows. First of all, a group of design parameters related to the design object that include a design parameter to be temporarily set are read from the design-parameter management unit 22. Subsequently, previously field-proven data cataloged in advance in a design-parameter data base 18 by the function for temporarily setting design parameters is searched for a most appropriate value with the group of design parameters used as a key. The optimum value found by the search is then sent by the function for temporarily setting design parameters to the requesting design-parameter management block. In this case, a commonly known method that is already applied to a variety of contemporary applications can be used as a searching technique.

Furthermore, the execution block also has a function for estimating a production cost. This function estimates a cost by calculating an estimate value as a function of design parameters input from the design-parameter management unit 22. The estimate cost is sent to the analysis-result storage function 26. Later on, when the trade-off evaluation unit 27 evaluates a trade-off relation among design sections or among evaluation items, the estimate cost can be used as a clear evaluation indicator, allowing an optimum design solution to be found with ease.

Referring to the system shown in FIG. 2, the hardware configuration provided by the present invention is described in actual terms as follows.

As shown in FIG. 2, the multibus 11, the bus controller 12, the central processing unit 13, the disk controller 17, the main storage device 14, the display unit 12, the keyboard 15 and the disk drive 18 cited earlier constitute a workstation. In the main storage device 14, the functions of the method for cooperated design shown in FIG. 1 are stored. As described previously, the functions include the data input unit, the design-parameter management unit, the analysis-program registration unit, the analysis unit, the analysis-result storage unit, the trade-off evaluation unit and the result display unit. On the other hand, the disk drive 18 is used for storing design parameters administered by the design-parameter management unit 22, analysis results managed by the analysis-result storage unit 26 and analysis programs controlled by the analysis-program registration unit 23. The central processing unit 13 executes the functions stored in the main storage device 14, implementing the cooperated design.

Figure 3:
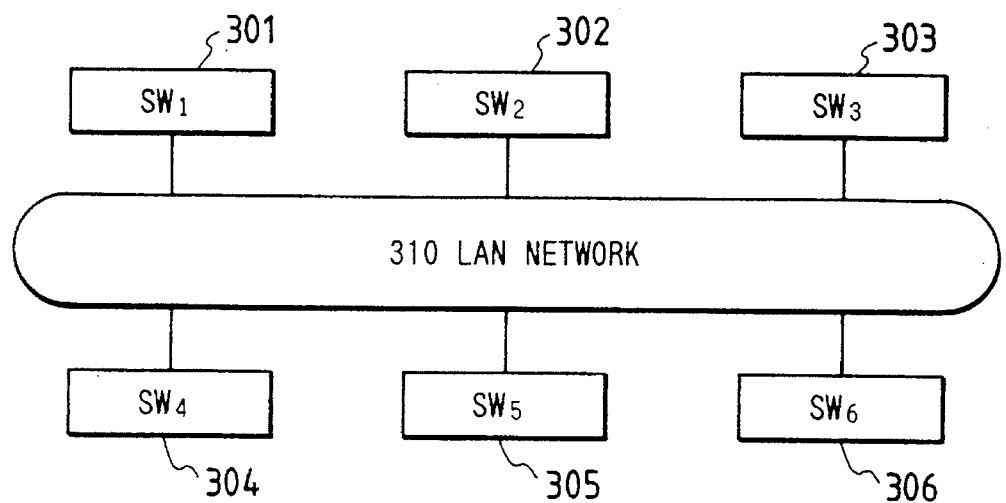
FIG. 3 is a diagram showing a network configuration of the present invention.

Furthermore, a network system can be built into a LAN configuration by connecting a plurality of workstations each of which is shown in. FIG. 2. In addition to the multibus 11, the bus controller 12, the central processing unit 13, the disk controller 17, the main storage device 14, the display unit 12, the keyboard 15 and the disk drive 18 cited earlier, the workstations each comprise a communication controller and a modem for connecting them to each other. FIG. 3 shows six workstations WS1 to WS6 denoted by reference numerals 301 to 306 respectively and connected to form a loop LAN network 310. Each of the workstations WS1 to WS6 has the above configuration.

In a distributed system, the workstations WS1 to WS6 shown in FIG. 3 can have the same configurations but in a centralized system, at least one workstation is used as a server. In this case, the main storage device of the server workstation is used for storing the design-parameter management unit 22, the analysis-program registration unit 23, the analysis-result storage unit 26 and the trade-off evaluation unit 27 of the functions of the method for cooperated design shown in FIG. 1 whereas its disk drive is used for storing design parameters administered by the design-parameter management unit 22, analysis results managed by the analysis-result storage unit 26 and analysis programs controlled by the analysis-program registration unit 23. On the other hand, the main storage device of a workstation assigned to a design section or an object is used for storing the data input unit 21, the analysis-result display unit 28 and the function for temporarily setting design parameters of the functions of the method for cooperated design shown in FIG. 1 whereas its disk drive is used for storing previously field-proven parameters managed by the function for temporarily setting design parameters.

Design parameters corresponding to a design plan inputted through the data input unit of a workstation of each design section are sent to the design-parameter management unit of the server workstation in the network through the modems. Receiving the design parameters, the server workstation invokes a corresponding analysis program. When design parameters required for the execution of the analysis program are not all gathered, the workstations of objects or design sections having the duty of determining parameter values is requested through the modems and the communication controllers to temporarily set the missing design parameters.

Receiving such a request through its modem, the workstation of the design section activates the function for temporarily setting design parameters stored in its main storage device, retrieving a design-parameter value from its disk drive. The design-parameter value is then sent to the server workstation through the modems and the communication controllers where it is used by the design-parameter management unit for setting a design parameter missing from the disk drive. Analysis results, a collection of data accumulated in the disk drive of the server workstation, are evaluated in terms of the trade-off relation among design sections, blocks or evaluation items by the trade-off evaluation unit residing in the main storage device. The evaluation results are then transmitted to the workstations of relevant design sections through the modems and communication controllers. The workstation of each design section or object then outputs the received evaluation result to its display unit for visual verification by means of the result display function residing in its main storage device. In order to change a design parameter that has been once set or temporarily set, a value is re-input by the data input unit and then transmitted to the server workstation through the communication controllers and modems for replacing the value modified by the design-parameter management unit. In this way, a method for cooperated design can be implemented even for a distributed system comprising design sections located in areas remote from each other.

The method for cooperated design provided by the present invention is explained by taking its application in the design of a semiconductor plastic design as an example. FIG. 4 is an explanatory diagram depicting a die of an ordinary LSI package. A finished product 421 is produced by cutting and separating each chip from a frame 420 having undergone a resin molding formation process for each chip on the frame 420. The frame 420 is, in turn, manufactured by bonding each LSI chip 401 with gold wires 402 to a multi lead frame 403. Reference numerals 409 and 405 are upper and lower dies for accomplishing the resin molding formation process. The lower die 405 has cavities 404 allowing chips 401 on the lead frame 403 to undergo molding at the same time. A runner groove 406 for flowing melted plastic to the cavities 404 and a cavity gate 407 for each cavity 404 are engraved on the lower die 405. The upper die 409 is provided with a pot 410 receiving plastic and a plunger 413 fitting into the pot 410 for inserting the pot 410. A heater 408 is embedded in the upper and lower dies 409 and 405 for melting the plastic.

Figure 5A:
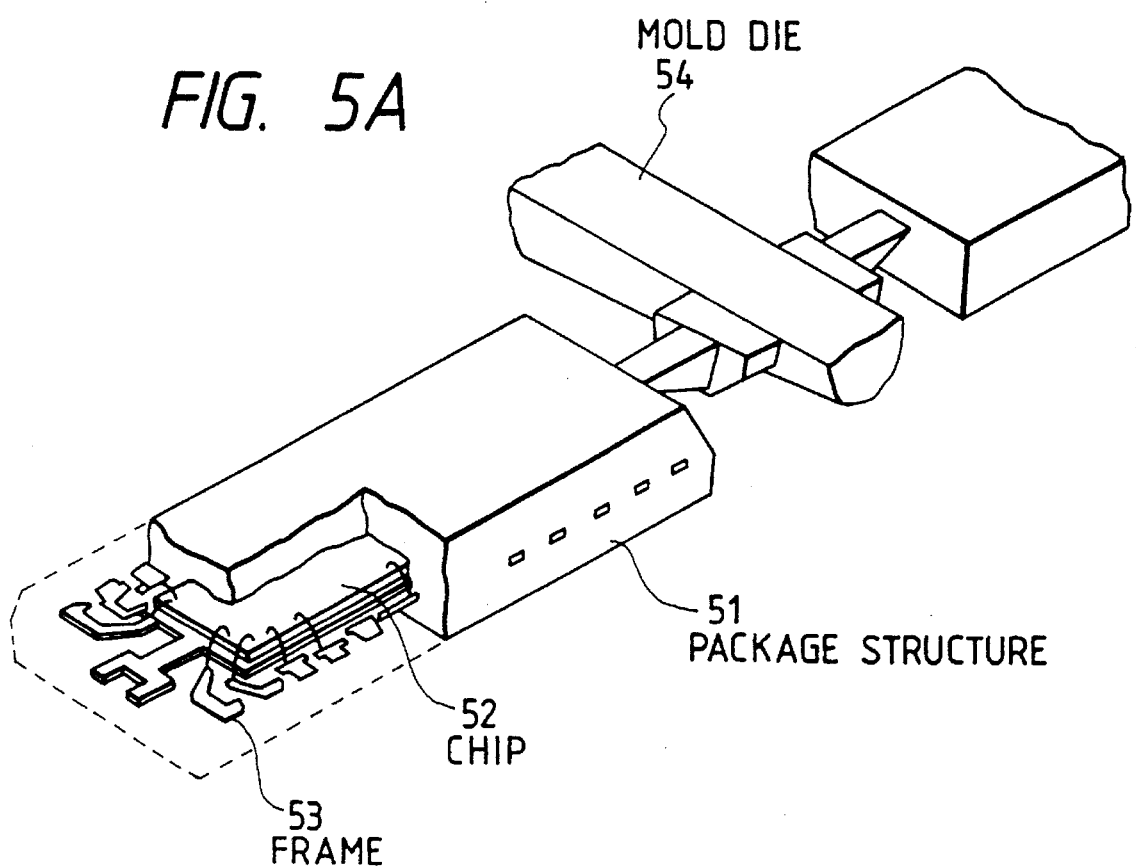
FIG. 5A is a diagram used for explaining design of semiconductor plastic packages carried out by using an embodiment according to the present invention.

FIG. 5A is a diagram showing an enlarged partial cross section of a chip cited above used for explaining the state of mold formation of the chip.

Specifications of a semiconductor plastic package are determined in a variety of design processes for a chip 52 embedding a circuit of semiconductor devices, a frame 53 for holding the chip 52 in a package 51 and electrically connecting the chip 52 to the external world, the package (PKG) 51 for encapsulating the chip 52 and the frame 53 within the external dimensions of the package 51 and a mold die 54 for flowing plastic into a cavity having the same external form as the package 51, packaging the chip 52 and the frame 53 and forming the package 51. The specifications are prepared by a circuit (layout) design section, a frame design section, a structure design section and a die design section which are responsible for the design processes. The circuit design section carries out design work with wiring efficiency of the circuit layout taken into consideration while evaluating, among other things, gold wire lengths on the chip 52. The frame design section designs an optimum frame shape so as to give a stressless state of bonding gold wires electrically connecting the package's external world to the chip which is placed on an extended area between bonding pad (pins) thereon and the frame. The structure design section designs a structurally strong component layout based on results of evaluation of thermal stress generated in the package made up of materials having different coefficients of thermal expansion such as metals and silicon which give rise to the thermal stress generated in the package. The die design section determines die specifications including the shape and the molding conditions while determining the viscosity and flow rate of plastic incoming into the cavity so as not to result in gold wires pressed and bent by the incoming plastic, and evaluating the flowing state of the plastic which is affected by an insert portion (the chip frame) dividing the cavity into two: upper and lower halves. Here, the following typical trade-off relations exist among design parameters handled by the design sections:

(1) The larger the distance from the bottom surface of the package to a chip pad, the less the thermal stress generated in the structure. Note that the chip pad is a frame portion on which the chip is placed and the distance is referred to hereafter as a dimension beneath chip pad. In this case, however, unbalanced plastic flow is very likely to occur on the insert portion during the molding process. Such unbalanced plastic flow, in turn, gives rise to an air fault or void left in the package.

(2) If the layout pattern of the bonding pad on the chip is set so as to give an optimum efficiency of circuit layout in the chip, the distance from the bonding position on the frame side becomes longer, making gold wires easily bendable during the molding process.

Figure 6:
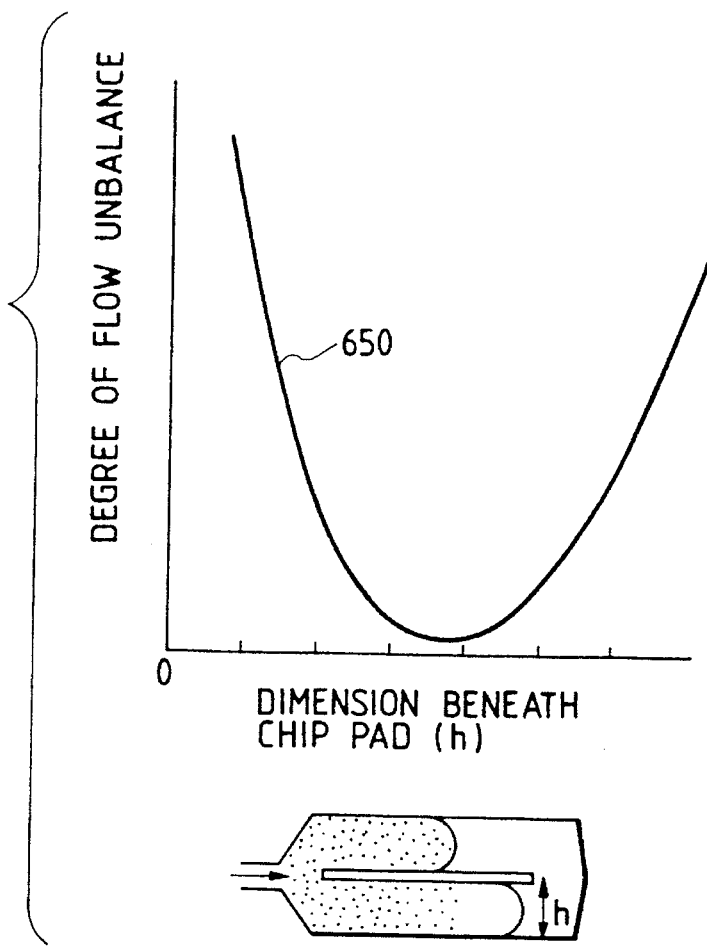
FIG. 6 is a diagram showing a graphical display of a characteristic representing a result of an analysis carried out in accordance with the present invention.
Figure 7:
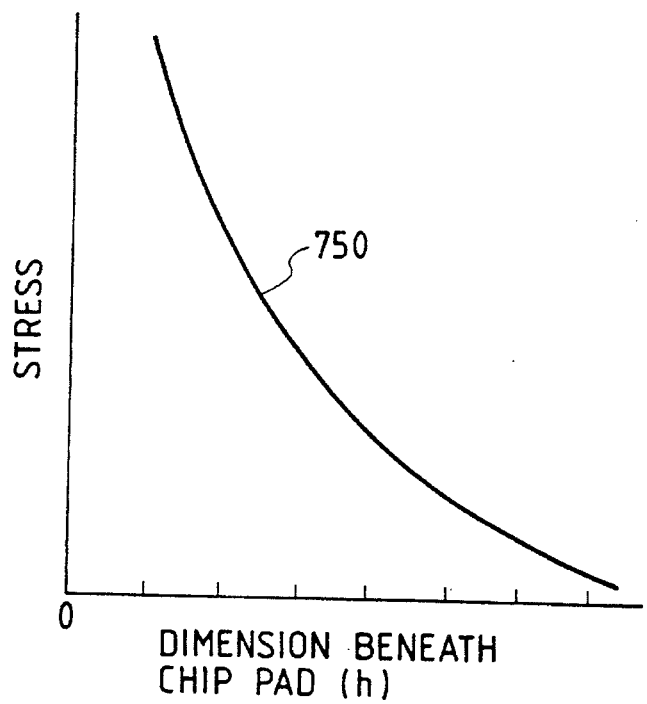
FIG. 7 is a diagram showing a graphical display of a characteristic representing a result of an analysis carried out in accordance with the present invention.

The above trade-off relations are described in detail by referring to diagrams. FIGS. 6 and 7 are diagrams for explaining trade-off relation (1) cited above. Both the figures show a curve or characteristic representing variations in parameter value with changes in dimension beneath chip pad (h) which are taken on the horizontal axis. As shown in FIG. 6, the variations in degree of flow unbalance are represented by a downward bent curve 650, giving a value on the horizontal axis corresponding to its bottom point as an optimum dimension beneath chip pad (h). On the other hand, the characteristic 750 shown in FIG. 7 represents monotonously decreasing values of the thermal stress with increases in dimension beneath chip pad (h). Accordingly, the value of the dimension beneath chip pad (h) that minimizes the degree of flow unbalance does not give a minimum value of the thermal stress. The present invention allows for trade off among characteristics representing overall points of view for a product without being one-sided toward a particular one of design parameters the characteristics of which give optimum values contradicting each other as is the case with the trade-off relation described above.

Figure 8:
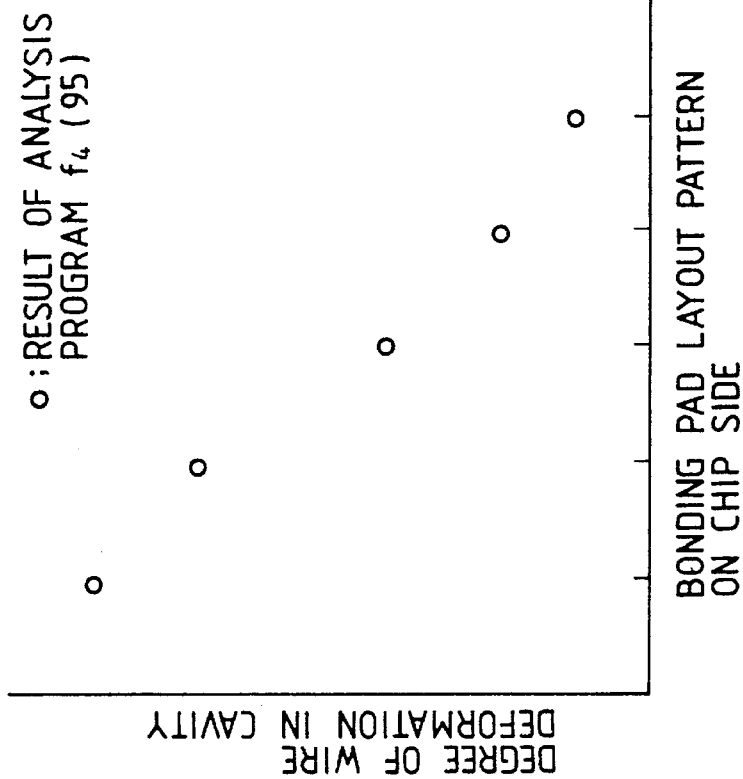
FIG. 8 is a diagram showing a graphical display of a characteristic representing a result of an analysis carried out in accordance with the present invention.
Figure 9:
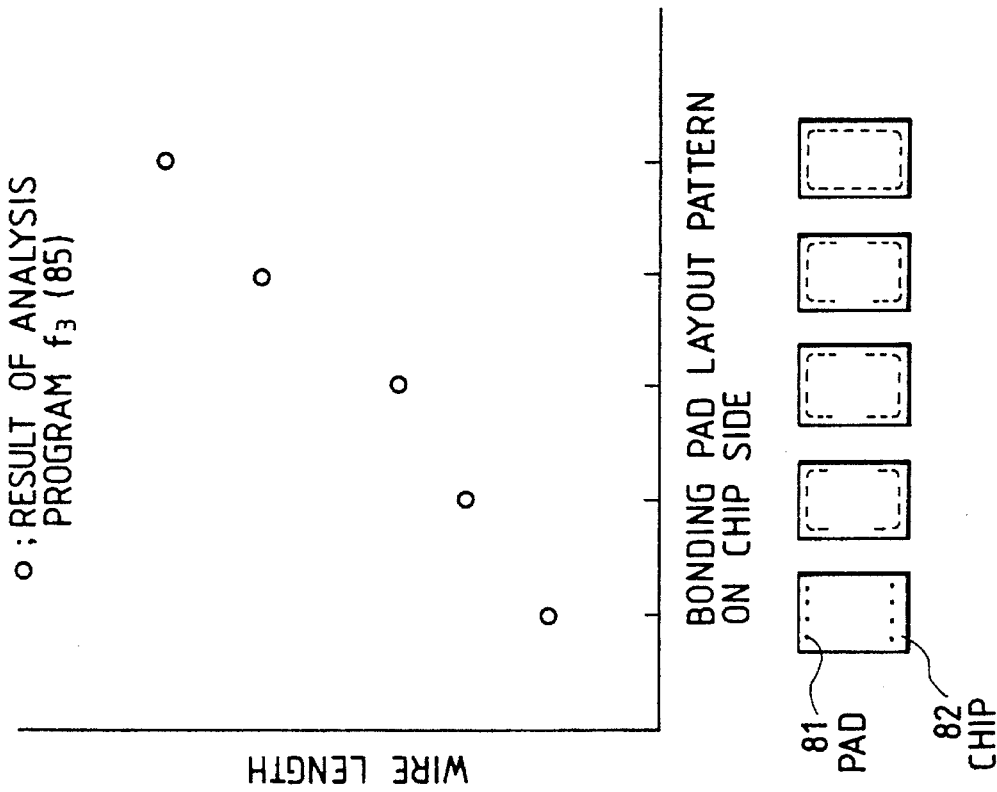
FIG. 9 is a diagram showing a graphical display of a characteristic representing a result of an analysis carried out in accordance with the present invention.

FIGS. 8 and 9 are diagrams for explaining trade-off relation (2) cited above. Both the figures use horizontal axes for representing the same thing: the types of layout patterns of the pad 81 on the semiconductor chip 82. Thus, the horizontal axes represent discrete values instead of analog ores. Five types are shown in each of the figures. Layout patterns include, among other things, pads lined up along an edge and a center line in the longitudinal and transversal directions which are known so far, or the actually implemented layout pattern. Parameter values 85 and 95 plotted on FIGS. 8 and 9 are results computed by analysis programs f3 and f4 respectively. The figures show characteristics representing monotonously changing values but in directions opposing each other. Also in this case, much like trade-off relation (1), it is an object of the present invention to allow an optimum trade off among characteristics contradicting each other to be taken as a degree of desirability for a product as viewed from all standpoints.

In order to perform evaluation with the aforementioned trade-relations (1) and (2) taken into consideration, it is necessary to gather a variety of design parameters determined by various design sections at the evaluation time. In actuality, however, there is a lack of uniformity in the design progress among the design sections. As a result, a leading design section cannot conduct an analysis due to the fact that design parameters are not complete.

Next, a processing procedure provided by the invention for solving the problem and, hence, eliminating the contradiction is described.

Prior to system activation, a data table having a format shown in FIG. 10 is stored in the disk 18 and to be controlled by the design-parameter management unit 22. As shown in the figure, for each of the names of a bunch of design parameters 1012 determining semiconductor-package specifications, a code 1011, the name of a design section 1013 having the duty of determining parameter values, information 1014 indicating whether or not a trade-off relation exists among evaluation items and the name of a corresponding analysis program 1015 are defined in advance.

The analysis-program registration unit 23 shown in FIG. 1 stores analysis programs 1101 for evaluation items in advance into the disk 18 in a tabular format shown in FIG. 11. As shown in FIG. 11, each of the analysis programs is given a name 1112 after its corresponding evaluation item. Each program name 1112 is associated with the name of the code f1 to f4 of its evaluation item denoted by reference numeral 1111 and the names of design parameters 1113 required for the execution of the analysis program.

First Embodiment

Figure 12:
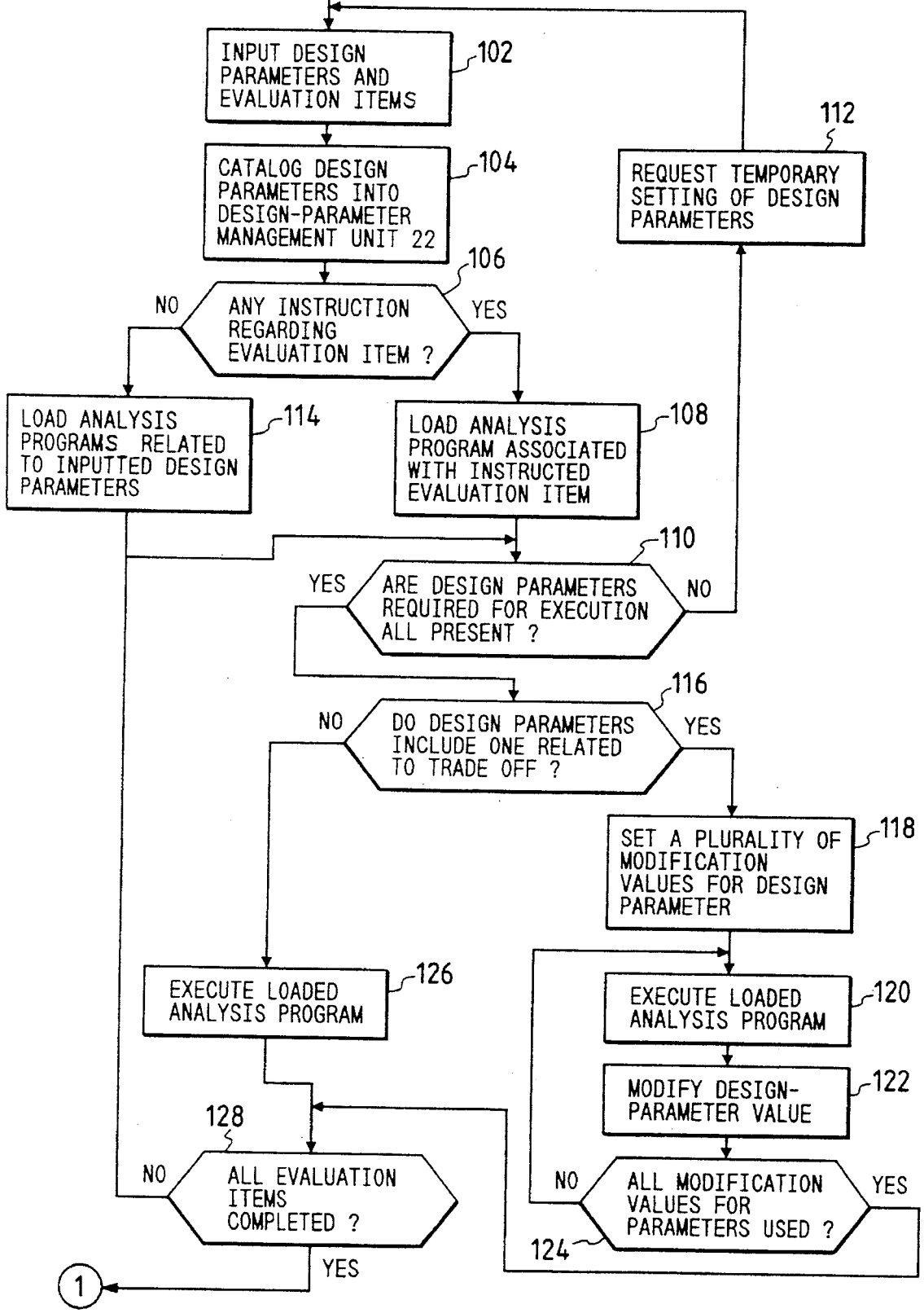
FIG. 12 is a flowchart showing a processing procedure according to the present invention.
Figure 13:
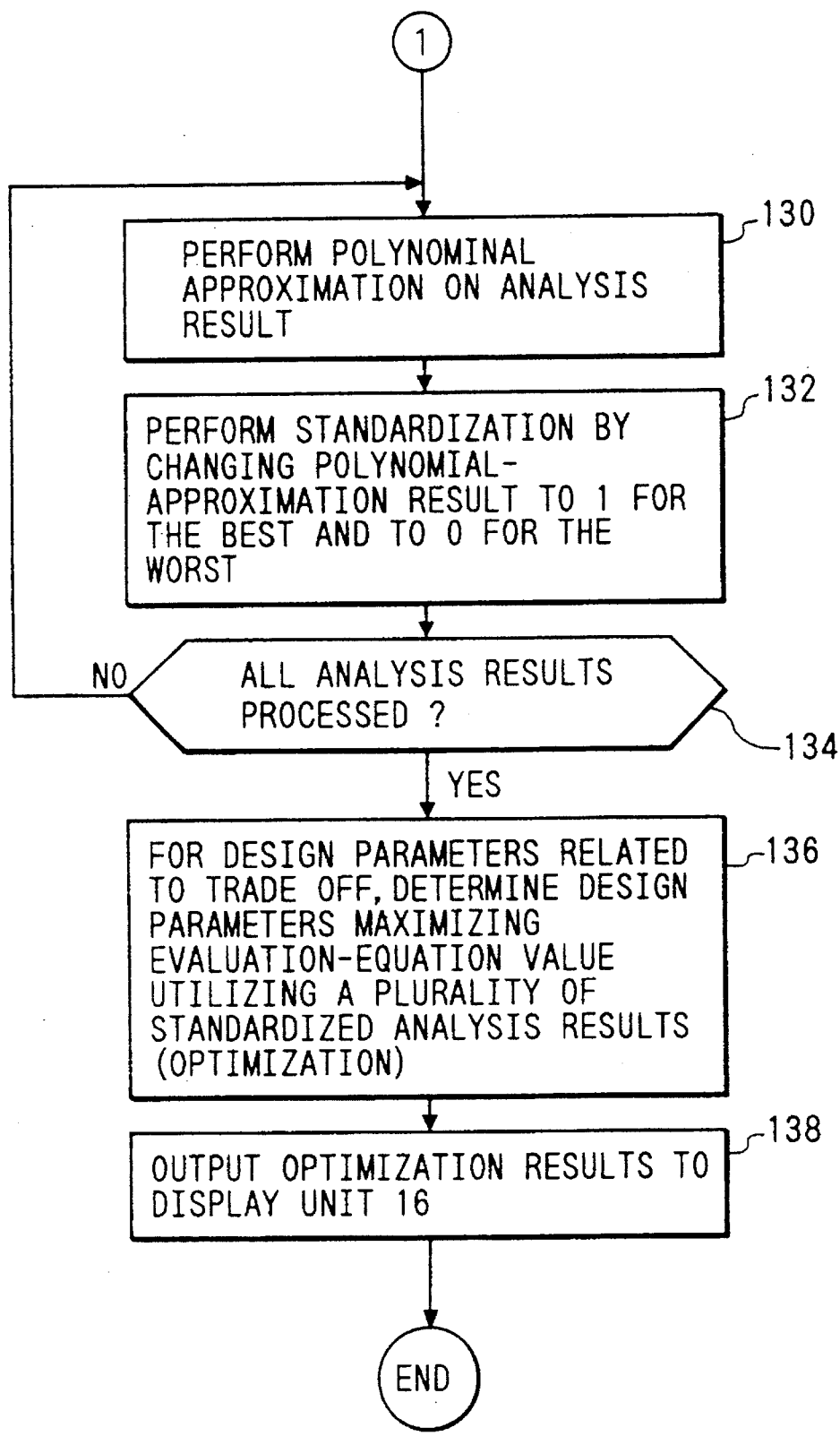
FIG. 13 is a flowchart showing a processing procedure, a continuation of the procedure shown in FIG. 12, according to the present invention.

Referring to flowcharts shown in FIGS. 12 and 13, a first embodiment for carrying forward design work, to be more specific the setting of design parameters, involving design sections described previously is described with pieces of the design work started one after another from the structure design section.

A design system allowing for collaboration among design sections in a production plant is described as follows. These design sections can also be treated as objects of an already known expert system or blocks of a functional block system to give a similar system. In this case, however, a first embodiment that supports the conventional collaboration among design sections is explained in detail.

First of all, the operator working in the structure design section enters input data such as external dimensions, a dimension beneath chip pad, test data of thermal stress generated in the package and properties of plastic making up the package and an evaluation item, a stress analysis in this case, via the keyboard shown in FIG. 2. In Processing 102, the data input unit 21 reads the input data and the evaluation item into the system. Subsequently, in Processing 104, the design-parameter management unit 22 sets design parameters in the disk 18 using the input data. That is to say, the structure design section, the name of a design section having the duty of determining parameter values denoted by reference numeral 1013 shown in FIG. 10, sets the codes P1, P2, P3, P7, P12 and P13 denoted by reference numeral 1011 and owned by the structure design section.

Next, in Processing 106, the system determines whether an instruction regarding an evaluation item exists. In this case, the stress analysis inputted previously is accepted as an execution instruction, so, the analysis unit 24 is requested to carry out a stress analysis as an evaluation item. Receiving the request, the analysis unit 24, in turn, requests the analysis-program registration unit 23 to load a stress-analysis program f1 from the disk 18 and design parameters P1, P2, P3, P6, P7, P8, P9, P12 and P13 denoted by reference numeral 1113 and required for the execution of the program f1 from the table 1101 shown in FIG. 11. The program and the design parameters are then transferred to the main storage device 14 through the disk controller 17, the multibus 11 and the central processing unit 13. These loading, reading and transferring operations are accomplished in Processing 108. Here, in Processing 110, the analysis unit 24 compares the values of the parameters set in the disk 18 to the parameter names read into the main memory device 14, determining whether or not the values of the design parameters 1113 required for the execution of the program f1 have all been gathered. From the table 1113 shown in FIG. 11 it is obvious that the chip width P4 and the chip height P6 to be determined by the circuit design section, and the frame thickness P8 and the frame quality P9 to be determined by the frame design section are not available yet. In Processing 112, therefore, the system requests the circuit design section to determine the values of P4 and P6 and the frame design section to determine those of P8 and P9 using the function for temporarily setting design parameters 25.

Receiving the requests, the circuit and frame design sections set temporary values based on previous data and values under consideration. The temporary values are input by the data input unit 21 through the keyboard 15. In Processing 104, the data input as such is stored in the disk 18 by the design-parameter management unit 22. In Processing 106 that follows, the input data is found this time not to include an instruction regarding an evaluation item. Therefore, the flow continues to Processing 114 in which the analysis unit 24 requests the analysis-program registration unit 23 to load all analysis programs having the design parameters P4, P6, P8 and P9 as arguments from the disk 18 into the main storage device 14. In Processing 110, the analysis unit 24 checks the names of design parameters required in the execution of all the loaded analysis programs against design parameters that have already been set in the disk 18. As a result of the comparison, the analysis program f1 is identified. Next, in Processing 116, the analysis unit 24 searches the data structure 1010 for a design parameter for which a trade-off relation among evaluation items exists. In the search, P7, the dimension beneath chip pad, is found among the design parameters 1011 stored in the disk 18 as one for which such a relation exists as indicated by reference numeral 1014. In Processings 118 to 124, the analysis unit 24 thus requests the execution of the analysis program f1 by using different values of P7. In Processing 120, the analysis-result storage unit 26 stores analysis results produced by the analysis unit 24 into the disk 18 through the main storage device 14, the central processing unit 13, the multibus 11 and the disk controller 17. If in Processing 124, the analysis unit 24 finds out that all the different values of the dimension beneath chip pad P7 have been used in the execution of the analysis program f1, the flow continues to the next step. At the end of the execution of the stress analysis program f1, analysis programs f2, f3 and f4 which are denoted by reference numeral 1101 in FIG. 11 and associated with the design parameters P4, P6, P8 and P9 have already been loaded in the main memory device 14. In Processing 128, the system requests the analysis unit 24 to repeat the operations described above for each of these analysis programs. That is to say, much like the stress analysis program f1, these analysis programs f2, f3 and f4 also undergo, among other processes, Processing 112 that requests temporary setting of undetermined design parameters.

The above processings are repeated to find analysis data shown in FIGS. 6 to 9. Among the results of the execution of the analysis programs f1 to f4, data related to the analyses f1 and f2 pertain to the structure design section. The data is retrieved from the disk 18 through the analysis-result storage unit 26 at a request issued by the trade-off evaluation unit 27.

Next, processing to evaluate an optimum condition based on trade-off among a plurality of design items is described in detail by referring to FIG. 13.

Figure 14:
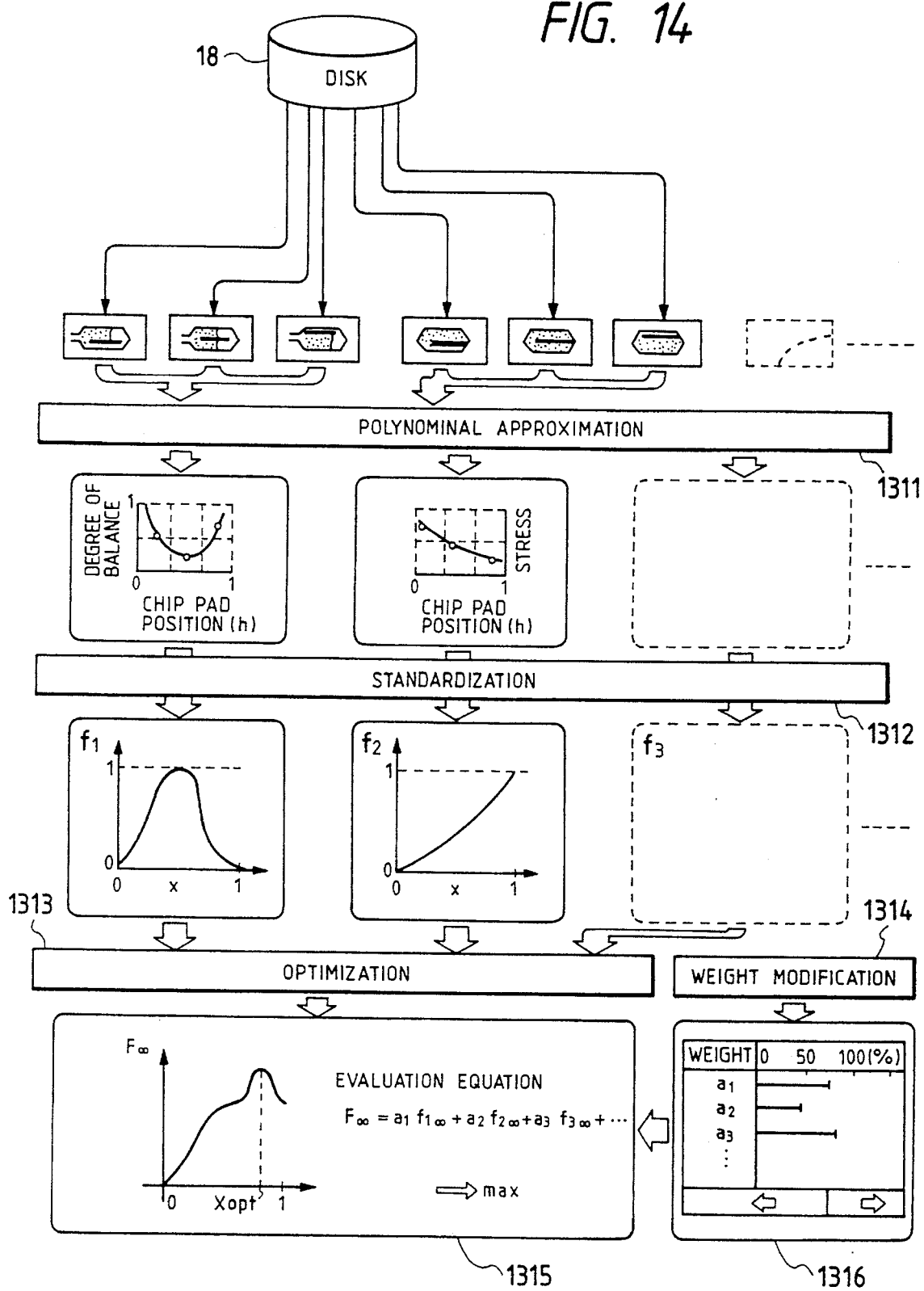
FIG. 14 is an explanatory diagram showing the concept of optimization evaluation provided by the present invention.

FIG. 14 shows a sequential flow of processings comprising polynomial approximation 1311, standardization 1312 and optimization 1313 for the characteristics each expressed as a function of dimension beneath chip pad shown in FIG. 6 and 7. The trade-off evaluation unit 27 applies the polynomial approximation to the produced analysis results by using the method of least squares. For example, a polynomial approximation for the stress value expressed as a function of dimension beneath chip pad is given as follows:

$$G(x) = \alpha_n x^n + \alpha_{n-1} x^{n-1} + \ldots + \alpha_0 \tag{1}$$

where x is the dimension beneath chip pad, G(x) is the stress value and $=\alpha_i$ is a coefficient. In Processing 130, the stress value is computed using the polynomial approximation expressed by Eq. 1.

In Processing 132, the subsequent processing, the trade-off evaluation unit 27 standardizes results computed by the above polynomial into values in the range 0 to 1, with the low and high-end values 0 and 1 representing the worst and best results respectively. A technique of conversion used in the standardization, a processing denoted by reference numeral 1312 in FIG. 14, is given by Eq. 2 below for the analysis results G(x) with its maximum value regarded as the best.

$$f(x) = \frac{G(x) - G_{min}}{G_{max} - G_{min}} \tag{2}$$

where f(x): conversion results x: design parameter

Gmax: Maximum of G(x)

Gmin: Minimum of G(x)

As for the analysis results G(x) with its minimum value regarded as the best, Eq. 3 given below is used for the standardization.

$$f(x) = \frac{G(x) - G_{max}}{G_{max} - G_{min}} \tag{3}$$

Processing 134 is used for checking if all analysis results required for optimization have undergone the polynomial approximation and the standardization. If not all the analysis results have completed the polynomial approximation and the standardization, the flow returns to Processing 130. Otherwise, it continues to Processing 136 in which the trade-off evaluation unit 27 finds a value of the design parameter, for example the dimension beneath chip pad in this case, that maximizes the value of an evaluation formula F(x) given by Eq. 4 as follows.

$$F(x) = a_1 f_1(x) + a_2 f_2(x) + \ldots \tag{4}$$

where fi(x): standardized analysis results ai: weight for fi(x)

It is obvious from Eq. 4 that the evaluation formula F(x) is represented in terms of a plurality of standardized analysis results.

Subsequently, in Processing 138, the result display unit 28 displays a graph representing the values of the evaluation formula found by the trade-off evaluation unit 27 for different values of the design parameter at the structure and die design sections and, at the same time, displays the optimum value of the design parameter which is denoted by Xopt in a processing block 1315 of FIG. 14. As such, in the structure design section preceding other design sections, analyses for a variety of evaluation items are carried out by using temporary values of design parameters received from the other design sections. Accordingly, design specifications that are agreed upon by the other design sections can be selected with care at an early stage. FIG. 14 is a diagrammatical representation of the processings described above. Weight adjustment and a display screen denoted by reference numerals 1314 and 1316 respectively in FIG. 14 indicate that the coefficients a1, a2, and so on used in the evaluation formula expressed by Eq. 4 can be appropriately modified in accordance with the type of the product and conditions under which the evaluation formula is applied.

Below is description of a next case. In this case, the user in the circuit design section enters input data including a chip width, a chip length, a chip height, layout-pattern data of the chip-side bonding pad and chip internal wiring coordinates via the keyboard 15. Let us assume that the inputted values of the layout-pattern data of the chip-side bonding pad P16 and chip internal wiring coordinates P17 are different from the values temporarily set at the previous structure-design stage.

In Processing 102, the input data unit 21 inputs the data inputted via the keyboard 15 into the system. Subsequently, in Processing 104, the design-parameter management unit 22 sets design parameters in the disk 18 using the input data. That is to say, the circuit design section, the name of a design section having the duty for determining values denoted by reference numeral 1013 shown in FIG. 10, sets the codes P4, P5, P16 and P17 denoted by reference numeral 1011 and owned by the circuit design section. Next, much like the structure design section described previously, in Processing 106, the system determines whether an instruction regarding an evaluation item exists.

In Processing 106 that follows, the input data is found out not to include an instruction regarding an evaluation item. Therefore, the flow continues to Processing 114 in which the analysis unit 24 requests the analysis-program registration unit 23 to load all analysis programs having the design parameters P16 and P17 with their values changed as arguments from the disk 18 into the main storage device 14. In Processing 110, the analysis unit 24 checks the names of design parameters required in the execution of all the loaded analysis programs against design parameters that have already been set in the disk 18 including those set temporarily. As a result of the comparison, the analysis program f3 and f4 are identified. Next, in Processing 116, the analysis unit 24 searches the data structure 1010 for a design parameter for which a trade-off relation among evaluation items exists. In the search, P16, the chip-side bonding pad layout pattern, is found among the design parameters used by the analysis programs f3 and f4 as one for which such a relation exists as indicated by reference numeral 1014. In Processings 118 to 124, the analysis unit 24 thus requests the execution of the analysis programs f3 and f4 by using different values of P16. Thereafter, the processings are carried out in the same way as the structure design section described earlier. That is to say, In Processings 128 to 136, trade-off between the chip internal wire length and the degree of wire deformation in cavity is evaluated with the layout pattern of the chip-side bonding pad used as a parameter. In Processing 138, a graph representing evaluation results and an optimum value of the the layout pattern of the chip side bonding pad are displayed at the circuit design section. Characteristics of other parameters represented as a function of chip-side bonding-pad layout-pattern are similar to those shown in FIGS. 8 and 9. The value of a temporarily set parameter may change as the design work is carried forward. Even in such a case, related analysis programs are invoked immediately as described earlier. Accordingly, a design plan that requires a consensus from other design sections can be closely examined.

The above processes are also applicable to the succeeding die design and frame design as well. To be more specific, a corresponding analysis program is automatically executed for a modified parameter that has been set temporarily. Then, a design parameter that must be assessed from numerous points of view is optimized. As a result, optimum specifications of a product as viewed from all parameters can be found quickly without regard to the design progress.

Second Embodiment

So far, the first embodiment implementing a system for supporting cooperated design among design sections of a production plant has been described. Next, a second embodiment, an automatic system implemented as an expert system, is described by referring to diagrams.

Figure 15:
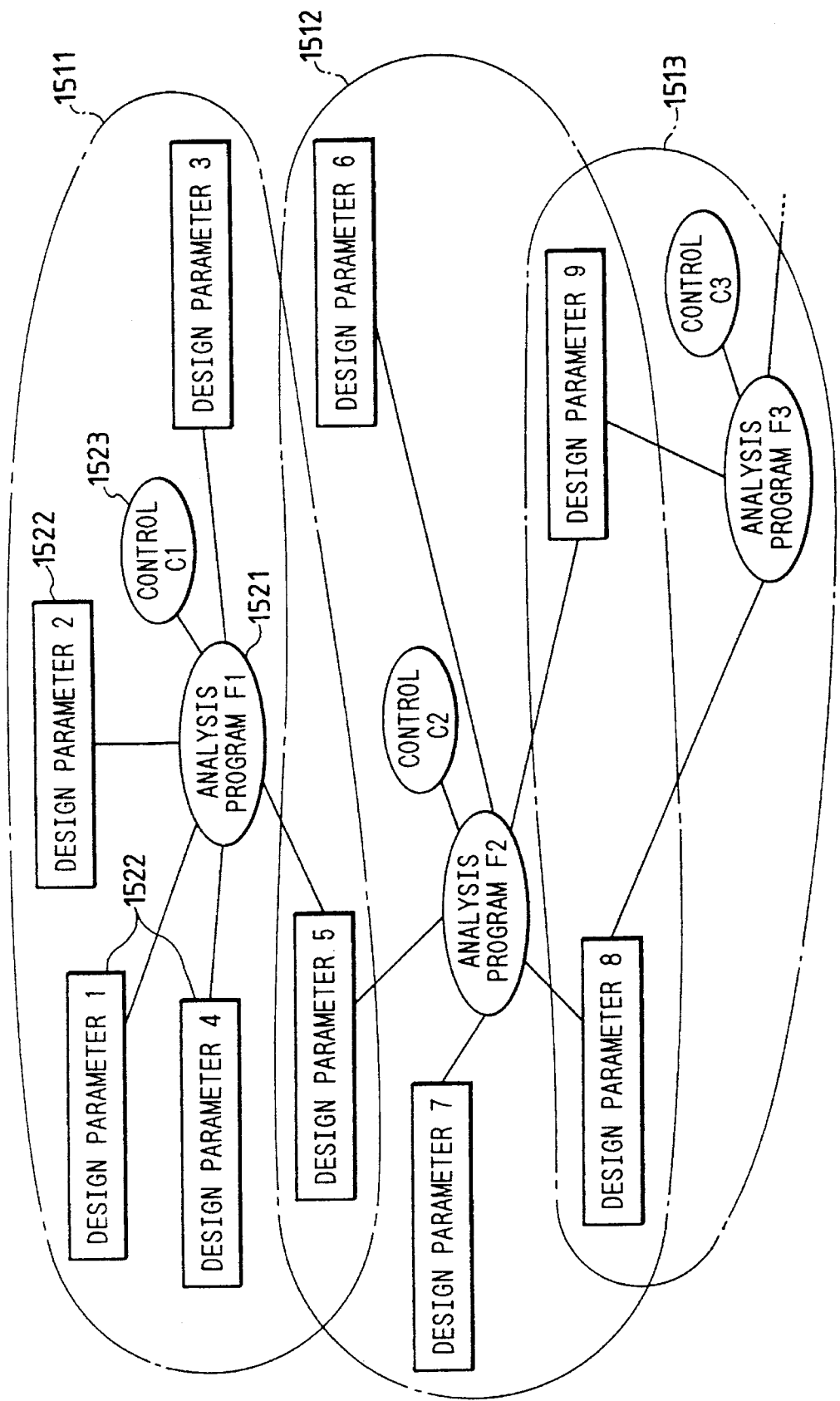
FIG. 15 is an explanatory diagram showing a second embodiment implementing an expert system in accordance with the present invention.

FIG. 15 is a diagram showing an expert system provided by the present invention for supporting collaborated design. As shown in the figure, the expert system comprises objects 1511, 1512 and 1513. Much like the Ordinary expert system, the objects 1511, 1512 and 1513 communicate with each other using a message-passing technique. Each of the objects 1511, 1512 and 1513 further comprises an analysis program Fi denoted by reference numeral 1521, a set of design parameters 1522 required for the execution of the analysis program Fi and an object controller Ci denoted by reference numeral 1523 for completely controlling the operation of the analysis program Fi. As shown in the figure, the objects 1511, 1512 and 1513 may share certain design parameters of a certain type. The analysis program Fi carries out an analysis similar to that of the program fi employed by the first embodiment. In addition, the set of design parameters 1522 are also similar to the group of design parameters Pi used in the first embodiment. Moreover, its actual flow of processing is also similar to that shown in FIGS. 12 and 13. Furthermore, interactions among the objects 1511, 1512 and 1513 are the same as that which would be obtained as if the design sections in the first embodiment were replaced by their corresponding-objects. Accordingly, a design section having the duty for determining values denoted by reference numeral 1013 in FIG. 10 can be replaced by an object equipped with a function for performing the design work of the design section.

That is why the actual processings carried out among the design sections of the first embodiment are applicable to the objects of the second embodiment.

Referring to FIGS. 16 to 19, operations carried out for the design sections of the first embodiment are described as operations to be carried out by the corresponding objects.

As shown in the figures, a block marked by slanting lines denotes an already set design parameter while the one with no slanting lines is an undetermined parameter.

Figure 16:
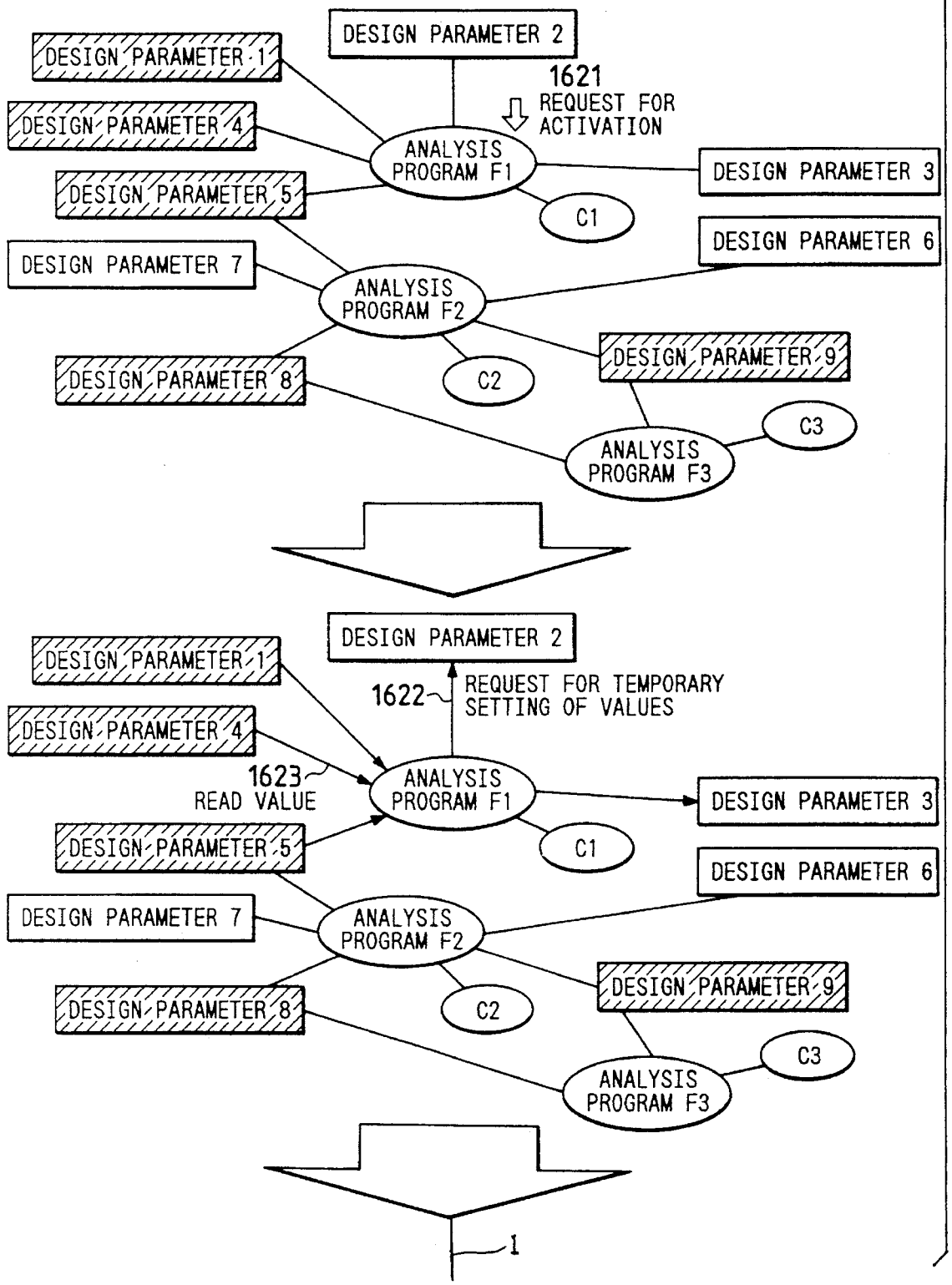
FIG. 16 is an explanatory diagram showing the principle of operation of the second embodiment according to the present invention.
Figure 17:
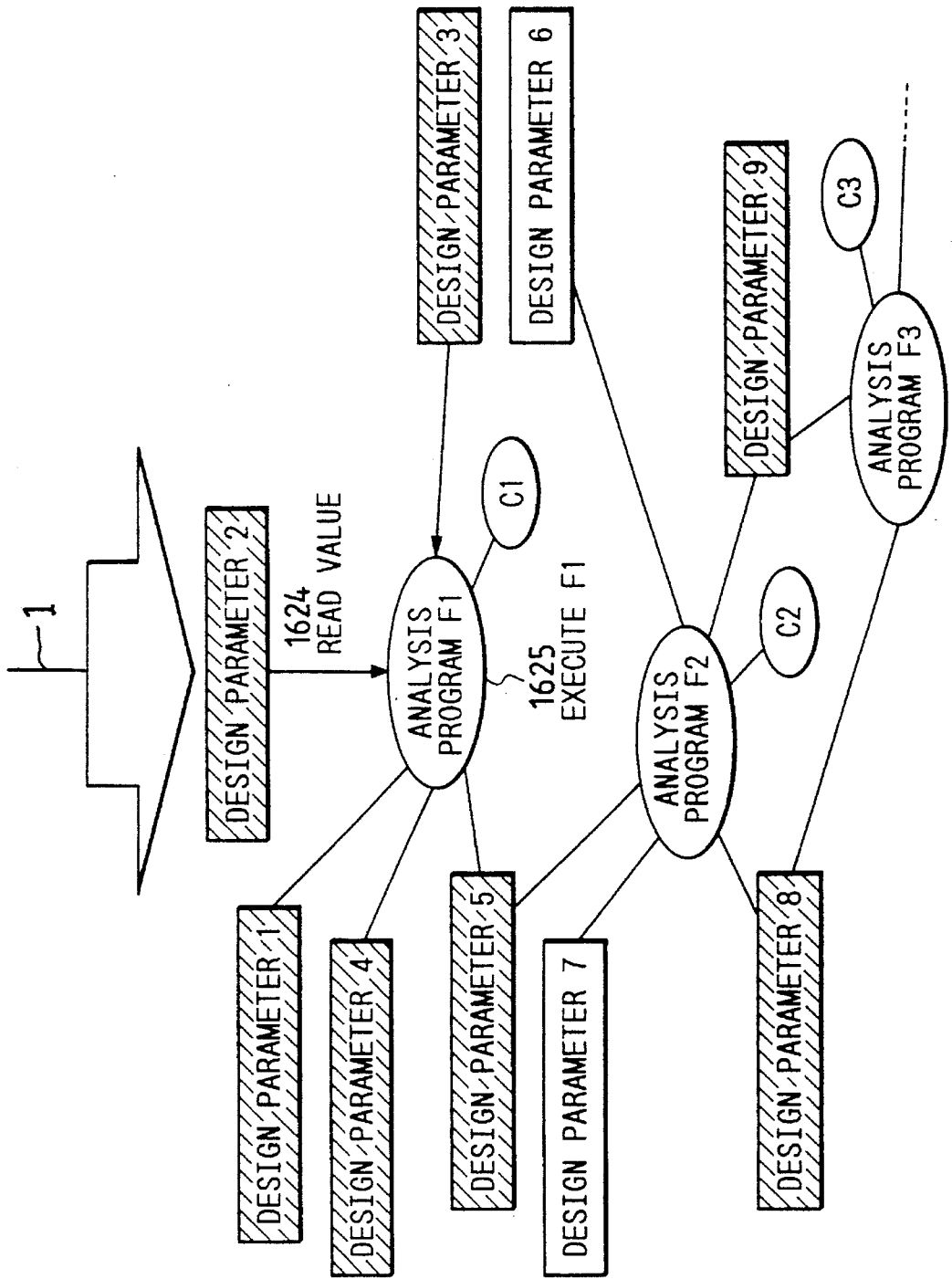
FIG. 17 is an explanatory diagram showing the principle of operation, a continuation of that shown in FIG. 16, of the second embodiment according to the present invention.

FIGS. 16 and 17 show an example in which evaluation of specifications is performed synchronously among a plurality of design items. Each operation can be seen by associating it with a processing in the flowcharts shown in FIGS. 12 and 13. Now, let a request 1621 for invocation of a thermal-stress analysis program F1 be made. This request 1621 corresponds to the existence of an instruction for an evaluation item judged by Processing 106 shown in FIG. 12, and hence the state in which the analysis program is loaded in processing 108. In response to the request 1621, the object 1511 executes Processing 110 and examines whether or not all design parameters required for the execution of F1 are gathered. As shown in FIG. 16, parameters 2 and 3 are not determined yet. Accordingly, a request 1622 corresponding to Processing 112 is made to temporarily set parameters 2 and 3. At the same time, an operation 1623 is executed to read the values of already set parameters 1, 4 and 5. Next, an operation denoted by reference numeral 1624 in FIG. 17 is performed to read temporarily set parameters 2 and 3. This operation 1624 corresponds to Processings 102 and 104 of the first embodiment. At this point, all the parameters required for the execution of F1 are complete. Processing thereafter denoted by reference numeral 1625 of F1 is then carried out.

Figure 18:
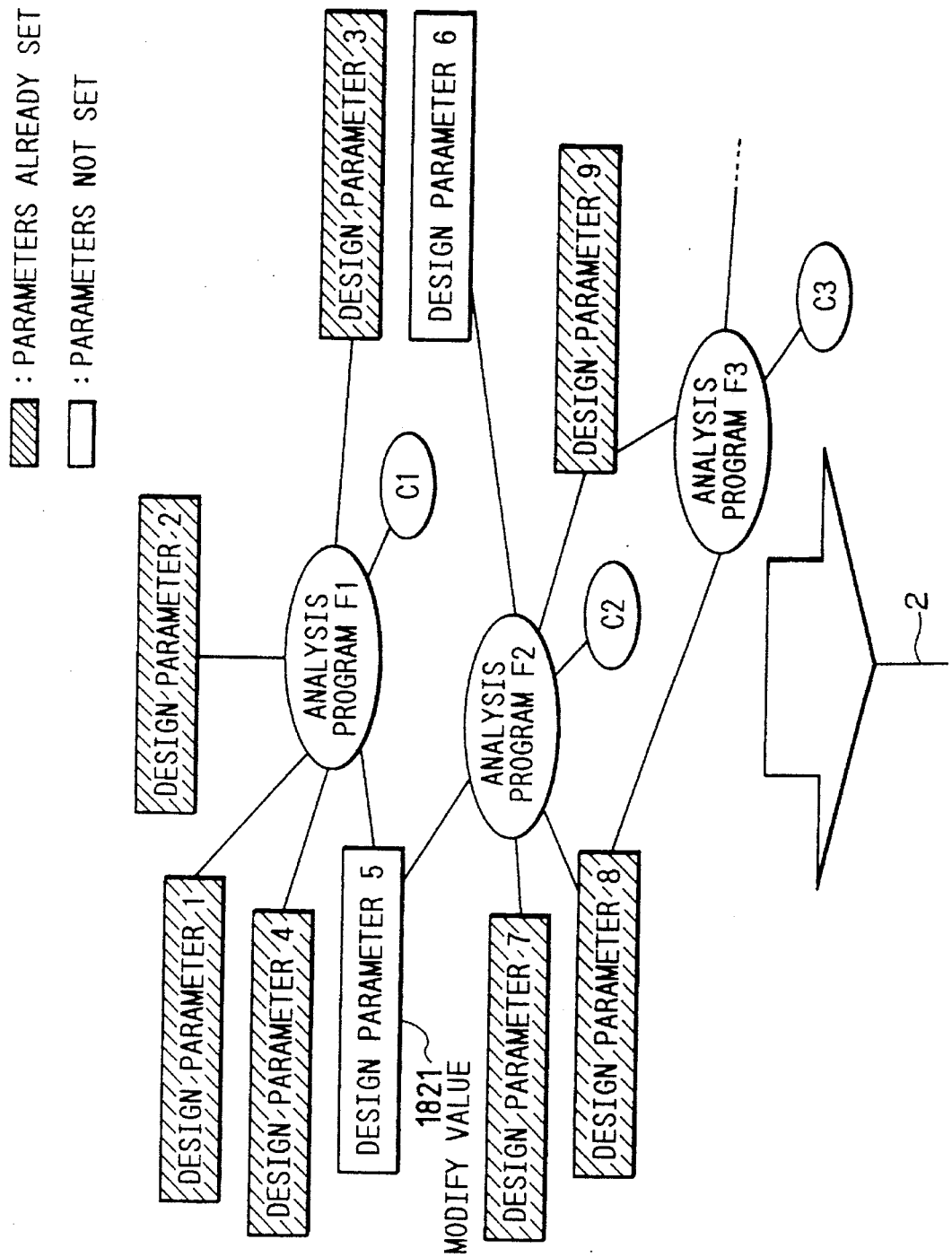
FIG. 18 is an explanatory diagram showing the principle of operation of the second embodiment according to the present invention.
Figure 19:
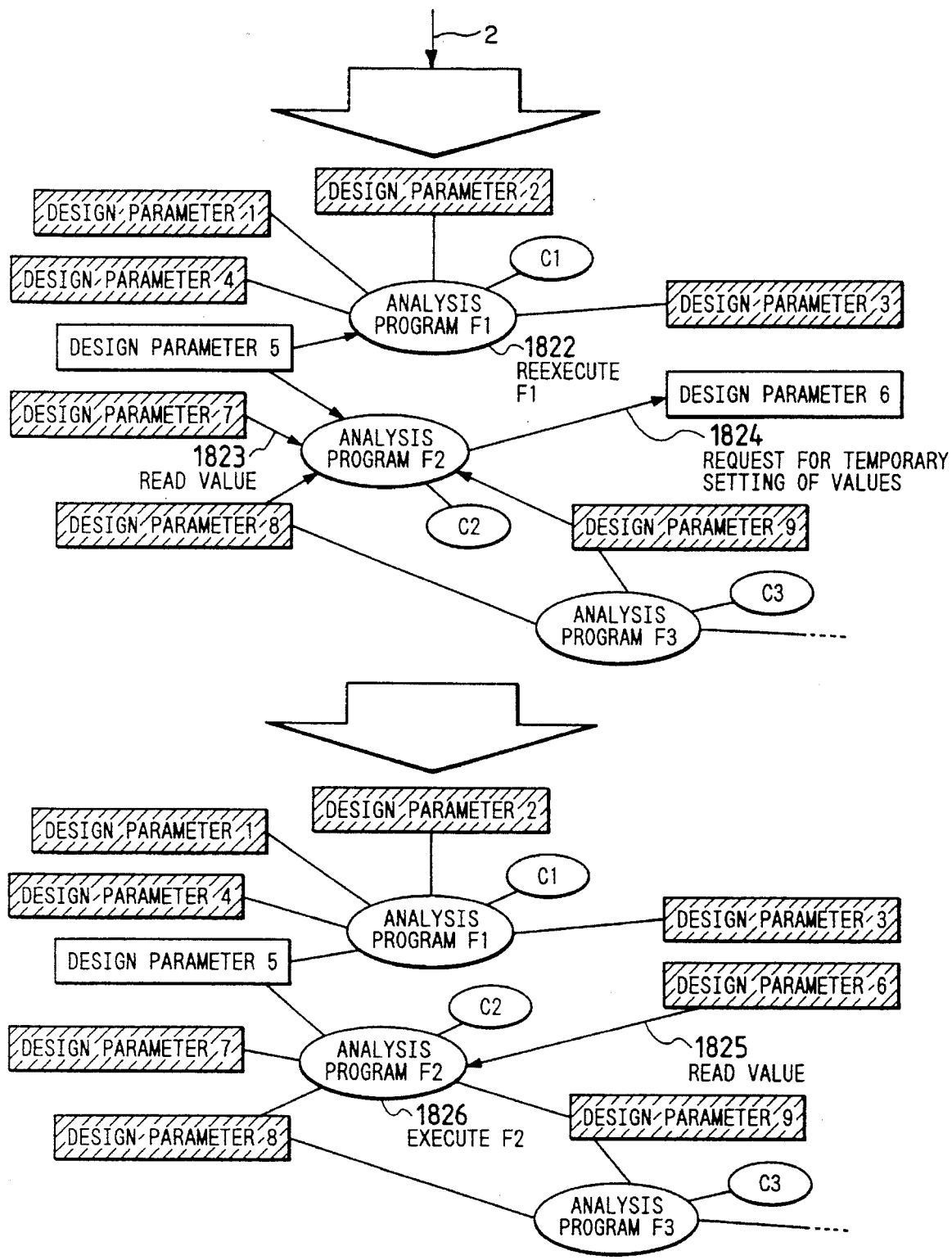
FIG. 19 is an explanatory diagram showing the principle of operation, a continuation of that shown in FIG. 18, of the second embodiment according to the present invention.

FIGS. 18 and 19 show the execution of F1 which corresponds to Processings 118 to 124 for a case in which a trade-off relation among evaluation items exists. A trade-off relation necessitates modification 1821 of the value of parameter 5 to which analysis programs F1 and F2 are related. Accordingly, an attempt is made to execute F1 and F2. Note that the execution of F1 and F2 corresponds to Processing 120. At that time, since design parameters required for the execution of F1 are all gathered, F1 can be re-executed immediately as denoted by reference numeral 1822 in FIG. 19. Since design parameters required for the execution of F1 are not complete, however, a request 1823 for temporary setting of design parameters is issued. The analysis program F2 then reads the temporarily set value of design parameter 6 as indicated by reference numeral 1825 and starts execution 1826. Thereafter, operations corresponding to Processing 118 for setting modified values for trade-off purposes and Processings 120 to 124, which are to be repeated as many times as the modified values, are executed so as to meet optimum trade-off conditions as is the case with the first embodiment.

So far, the second embodiment implementing a system for cooperated design by means of an expert system in accordance with the present invention has been described. The second embodiment according to the present invention allows processings including those shown in FIGS. 12 and 13 to be executed quickly in a semiautomatic to fully automatic way.

As it is obvious from the above description, the following effects are expected from the present invention:

(1) Analysis results can be obtained while design parameters required for the execution of each individual evaluation and analyses of evaluation items for design items are being solicited. At the same time, since optimization can be carried out by performing total evaluation of a plurality of evaluation items based on determination of set values, design specifications, that may not be necessarily optimum if viewed from each individual design item but optimum as viewed from all design items of the product, can be derived quickly without regard to the design progress.

(2) In the effect (1) described above, since design parameters required for execution of analysis programs can be procured automatically and undetermined design parameters can also be set temporarily for evaluation, optimum design specifications can be derived quickly.

(3) The apparatus for cooperated design for executing the above functions can be provided as a semiautomatic to fully automatic system which is implemented as an expert system making use of object oriented knowledge representations.

(4) The above apparatuses for determining values classified by design item are implemented as workstations which are distributed among design sections and linked to each other to form a network. Accordingly, even for design sections scattered at locations remote from each other in a distributed system, the network can support the coordinated design described in the effect (1). The network can also serve as a new FA (Factory Automation) or OA (Office Automation) system.

(5) When collating design specifications among design or evaluation items, an estimate manufacturing cost for the design specifications can be used as a denominator of evaluation, allowing optimum design values to be determined with ease.

Third Embodiment

Figure 21:
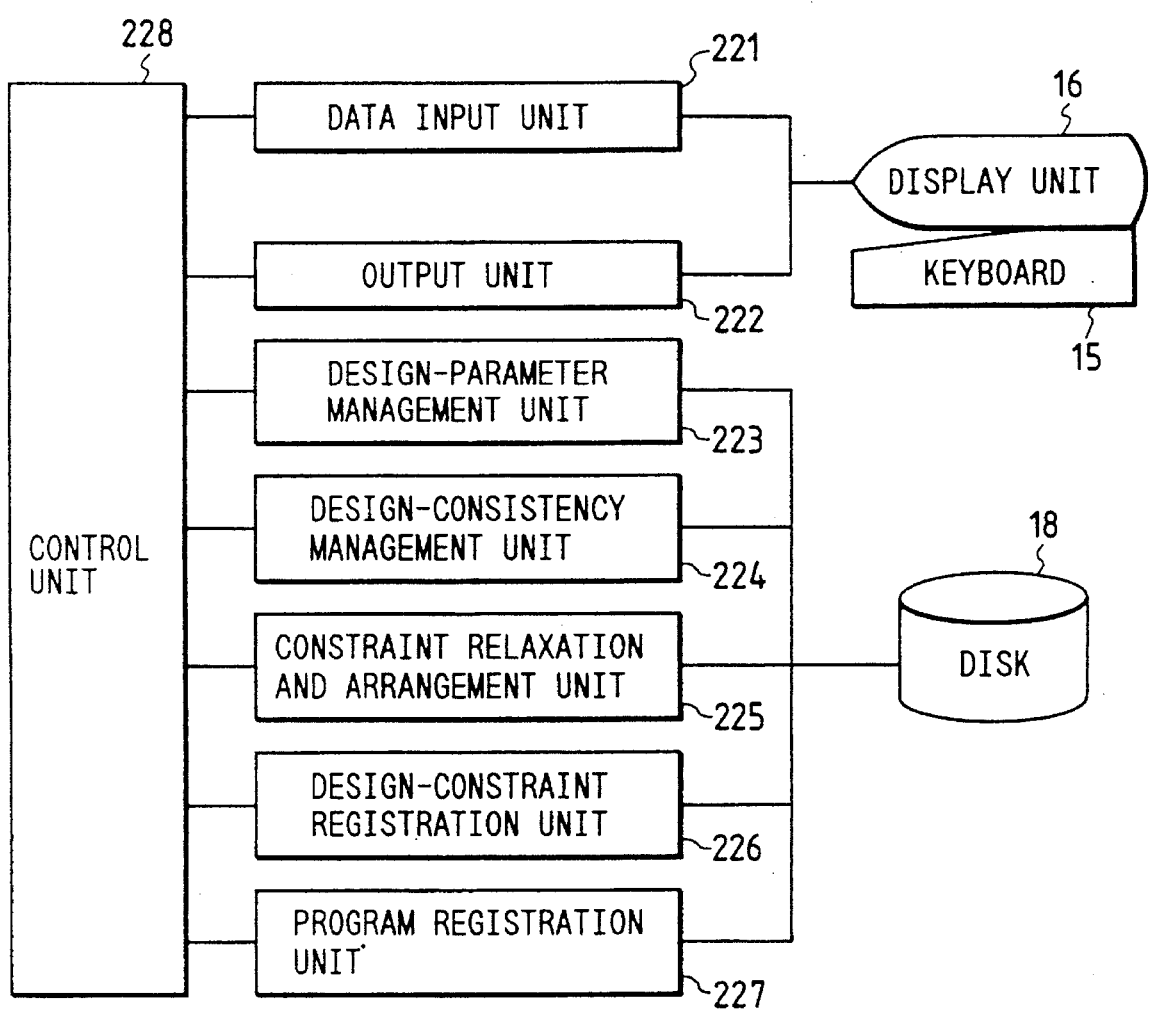
FIG. 21 is a diagram showing the configuration of software used in an apparatus for managing cooperated design provided by the present invention.
Figure 22:
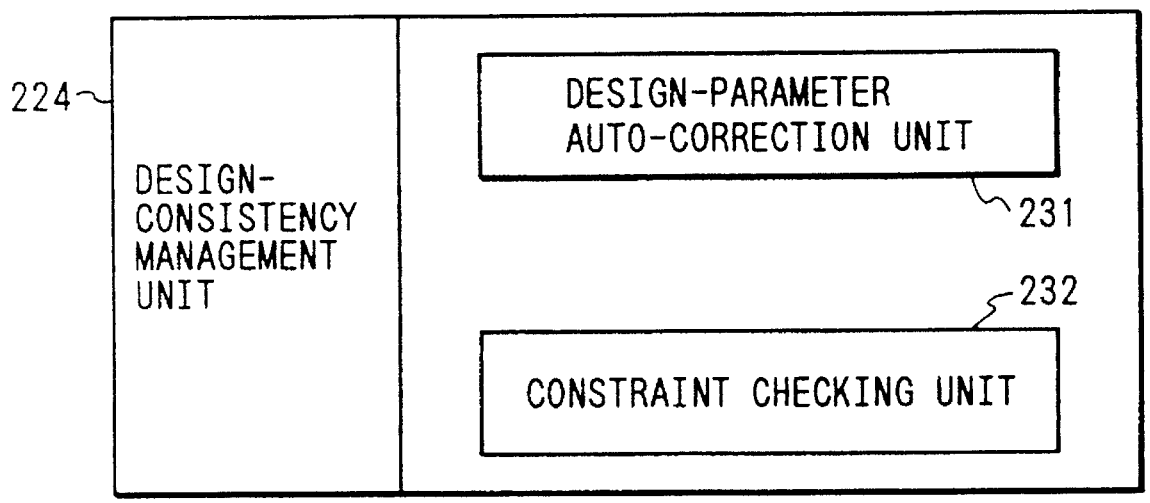
FIG. 22 is a diagram showing a detailed configuration of a design-consistency management unit provided by the present invention.
Figure 23:
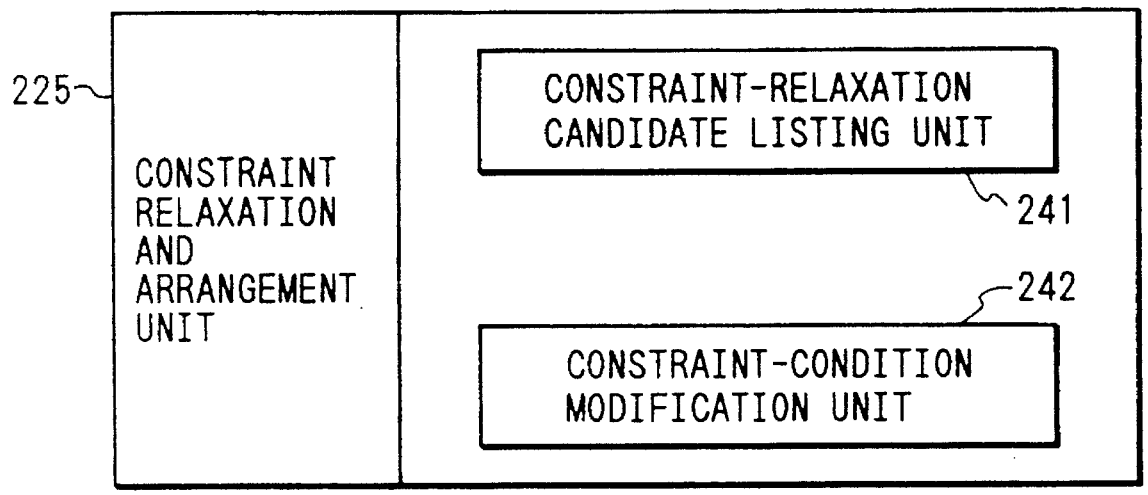
FIG. 23 is a diagram showing a detailed configuration of a constraint-relaxation and arrangement unit provided by the present invention.

In the description of an apparatus for managing cooperated design provided by the present invention, examples of hardware and software configurations are shown in FIGS. 2 and 21 respectively—As shown in FIG. 2, the apparatus for managing cooperated design comprises a multibus 11 controlled by the bus controller 12, a central processing unit 13 connected to the multibus 11 and a disk drive 18 also connected to the multibus 11 through a disk controller 17. The central processing unit 13 further comprises a main storage device 14, a display unit 16 and a keyboard 15. In this configuration, data inputted via the keyboard 15 is stored into the main storage device 14 and, at the same time, output to the display unit 16 by the central processing unit 13. Data stored in the main storage device 14 is transferred to the disk controller 17 through the multibus 11 to be stored in the disk drive 18. As shown in FIG. 21, the configuration of the software provided by the present invention comprises, among other units, a data input unit 221, an output unit 222, a design-parameter management unit 223, a design-constraint registration unit 226, a program registration unit 227, a design-consistency management unit 224, a constraint-relaxation and arrangement unit 225. As shown in FIG. 22, the design-consistency management unit 224 further comprises a design-parameter auto-correction unit 231 and a constraint check unit 232. As shown in FIG. 23, the constraint-relaxation and arrangement unit 225 comprises a constraint-relaxation candidate listing unit 241 and a constraint-condition modification unit 242.

Main functions of the units in the configuration of the software described above are described as follows.

The data input unit 221 inputs design parameters associated with a specification draft including external dimensions, materials and manufacturing conditions of a product which are inputted at each design section.

The design-parameter management unit 223 controls all design parameters of a product input via a data input unit means of each design section in an integrated manner, performing tasks for setting as well as modifying their values and verifying their presence.

The design-constraint registration unit 226 stores constraint conditions for each design parameter along with their set base data and, when necessary, retrieves the constraint conditions and the set base data.

The analysis-program registration unit 227 stores rules of relation among design parameters known also as transformation rules or a collection of analysis programs required for computing values of evaluation functions associated with design parameters and input/output data or the names of design parameters required for the execution of the analysis programs, and invokes an analysis program, creating an execution environment when necessary.

The design-consistency management unit 224 has the following two functions:

(1) Design-parameter auto-correction function

At a request to modify a design parameter input by the data input unit 221, all programs registered in the program registration unit 227 that treat the design parameter to be modified as an input value are invoked for execution through the program registration unit 227 and the output results are used as modified values of design parameters and set through the design-parameter management unit 23. Here, when the need for modification of another design parameter is identified by the design-parameter management unit 223, a program associated with the design parameter is executed and the output result is used as a modified value of a design parameter and set through the design-parameter management unit 23. Auto-correction of another design parameter, which is attributed to modification of one design parameter as such, occurs repeatedly like a chained reaction until such auto-correction is no longer necessary.

(2) Constraint check function

When the need for modification of a design parameter is identified by the design-parameter management unit 223 in the design-parameter auto-correction function described above, constraint conditions for the design parameter are read from the design-constraint registration unit 226, the new value of the design parameter is compared to constraint values and the comparison result is used for determining whether the new value satisfies the constraints.

The constraint-relaxation and arrangement unit 225 has the following two functions:

(1) Constraint-relaxation candidate listing function

The names of all design parameters treated as input items by programs handling design parameters specified by the data input unit 21 as output items are read by the program registration unit 227 and the constraint conditions and set base data associated with the read design parameters are retrieved and displayed through the design-constraint registration unit 226.

(2) Constraint-condition modification function

The function allows constraint conditions displayed by the above constraint-relaxation candidate listing function to be corrected interactively through the data input unit 221 and the corrected constraint conditions to be recataloged through the design-constraint registration unit 226. In this way, constraint conditions are relaxed one after another starting with that having a big margin to eventually give a design solution.

As described above, when a local design parameter is modified at an individual design section, the functions of the data input unit 221, the design-parameter management unit 223, the design-constraint registration unit 226, the program registration unit 227, the design-consistency management unit 224 and the constraint-relaxation and arrangement unit 225 allow all relevant design parameters affected by the modification to be auto-corrected and side effects resulting from the modification to be identified quickly. If a design solution that meets design constraints is not found, relaxation and reassesement of design constraints based on collaboration and a consensus among a plurality of design sections are carried out in order to make it possible to speed up the determination of design specifications at the prototyping stage of the product.

The method for managing cooperated design provided by the present invention is explained by taking its application in the design of a semiconductor plastic design as an example.

Figure 5B:
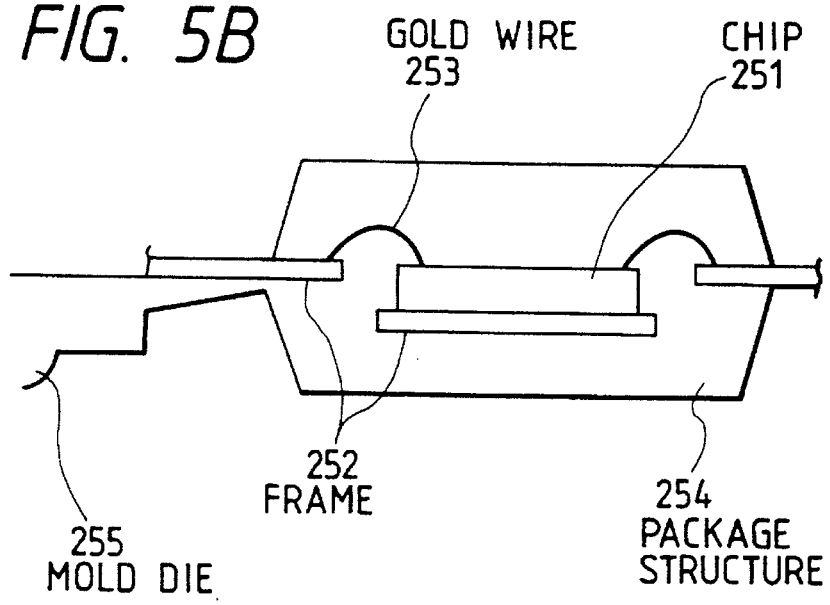
FIG. 5B is diagram showing the configuration of a semiconductor plastic package.

Specifications of a semiconductor plastic package are determined in a variety of design processes for components shown in FIG. 5B including a chip 251 embedding a circuit of semiconductor devices, a frame 252 for holding the chip 251 in a package structure 254 and electrically connecting the chip 251 to the external world, the package structure 254 for encapsulating the chip 251, gold wires 253 and the frame 252 within the external dimensions of the package structure 254 and a mold die 255 for flowing plastic into a cavity having the same external form as the package structure 254, packaging the chip 251 and the frame 53 and forming the package structure 254. The specifications are prepared by a circuit design section, a frame design section, a structure design section and a die design section which are responsible for the design processes. The circuit design section carries out design work with wiring efficiency of the circuit layout taken into consideration while evaluating, among other things, gold wire lengths on the chip 251. The frame design section designs an optimum frame shape so as to give a stressless state of bonding gold wires electrically connecting the package's external world to the chip which is placed on an extended area between bonding pad (pins) thereon and the frame. The structure design section designs a structurally strong component layout based on results of evaluation of thermal stress generated in the package made up of materials having different coefficients of thermal expansion such as metals and silicon which give rise to the thermal stress generated in the package. The die design section determines die specifications including the shape and the molding conditions while determining the viscosity and flow rate of plastic incoming into the cavity so as not to result in gold wires pressed and bent by the incoming plastic, and evaluating the flowing state of the plastic which is affected by an insert portion (the chip frame) dividing the cavity into two: upper and lower halves.

Examples of characteristics of design parameters handled by the design sections are listed below:

(1) The larger the distance from the bottom surface of the package to the bottom surface of the frame, the less the thermal stress generated in the structure. In such a structure, package cracks due to thermal stress can thus be avoided.

(2) The larger the frame thickness, the higher the rigidity. With a thick frame, unstability of component handling during the package manufacturing process and frame deformation during the molding process can thus be avoided.

(3) If the wire loop height is too large, wires are prone to deformation during the molding process and wire deformation, in turn, gives rise to a short-circuit. On the other hand, if the wire height is too small, wires will most likely come into contact with the frame and chip during the bonding process.

(4) If the distance from the top surface of the package to the wires is small, the wires are easily affected by noise coming from the outside of the package or the wires are prone to exposure to the surface of the package.

(5) If the distance from the bottom surface of the package to the bottom surface of the frame does not match the distance from the top surface of the package to the top surface of the frame, flow unbalance of the plastic will most likely occur during the molding process, giving rise to air remaining as void faults inside the package.

The design sections evaluate the characteristics of design parameters such as those listed above, prepare specifications of each component and design standards or constraints, and build a prototype of the product. Next, evaluation based on prototyping results is performed from a plurality of points of view such as reliability and producibility. If a problem is encountered, design parameters corresponding to faulty items and the like are corrected. However, design parameters are interdependent of each other so that, in some cases, it is necessary to modify other design parameters pertaining to other design sections when a design parameter is modified. In such a case, however, it is impossible to determine quickly whether or not the design parameter can be modified.

Figure 20:
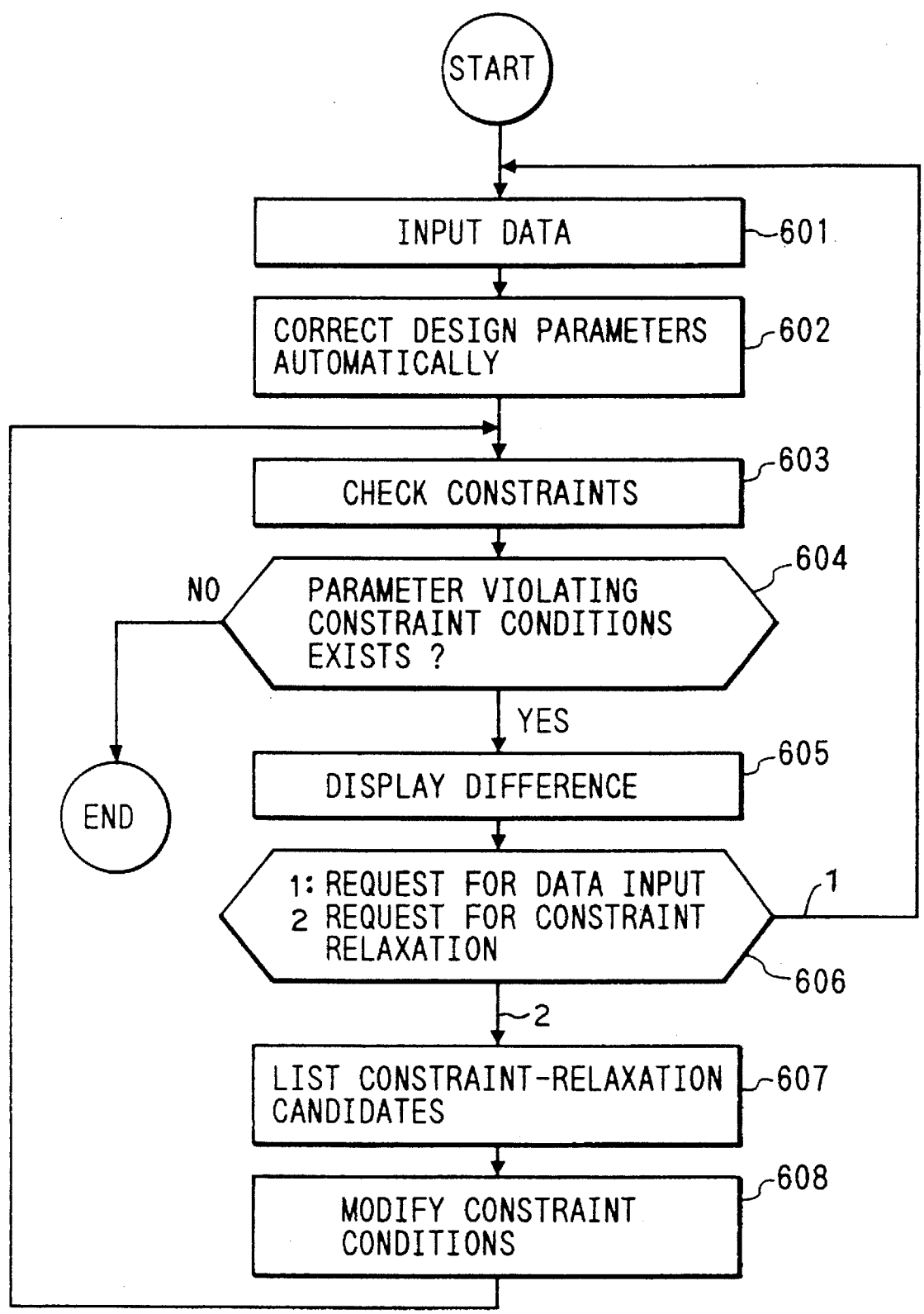
FIG. 20 is a diagram showing a skeleton flow of a processing procedure of a method for managing cooperated design provided by the present invention.

FIG. 20 is a skeleton flow diagram showing the processing procedure of the method for managing collaborated design according to the present invention. The processing procedure of the method for managing collaborated design is described as a means for solving the above problems as follows.

Figures 26, 27:
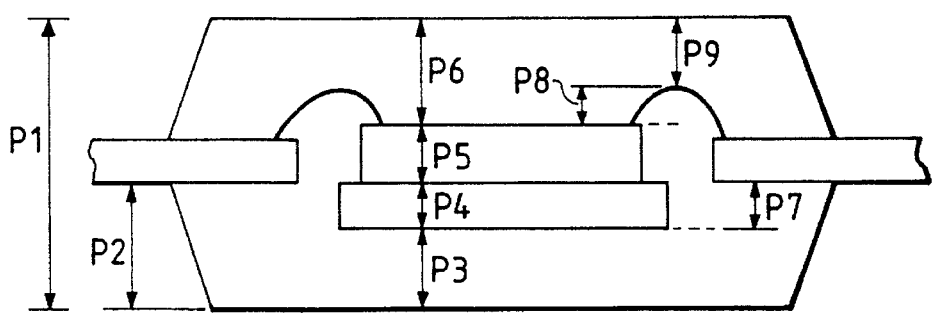
FIG. 26 is a diagram showing typical data in the disk controlled by a program registration unit.
FIG. 27 is a diagram showing a table of components and their associated design parameters of a semiconductor plastic package.

Prior to the start of a series of processings, design parameters for determining specifications of a semiconductor package are defined in advance on the disk 18 to be controlled by the design-parameter management unit 223 in a tabular format shown in FIG. 24. A value is set for each design parameter. Each design parameter is assigned a code name which denotes a corresponding quantity as shown in FIG. 27. Likewise, constraint conditions for the design parameters and names of empirical data serving as set bases for the constraints are defined in advance on the disk 18 to be controlled by the design-constraint registration unit 226 in a tabular format shown in FIG. 25. Examples of empirical data are shown in FIG. 28 (A) to (G). This empirical data is also stored in the disk 18. In addition, rules of relation among design parameters, programs for evaluation items, code names and input/output parameter names are defined in advance on the disk 18 to be controlled by the program registration unit 227 in a tabular format shown in FIG. 26. Under the preconditions described above, a joint study of design specifications based on evaluation results of a prototype of a semiconductor package among the structure design section, the frame design section and the die design section is explained as follows. Let us assume that during a thermal reliability test performed at a prototyping stage, a package crack is detected. The user at the structure design section increases P3, the distance from the bottom surface of the package to the bottom surface of the frame by inputting a larger value via the keyboard 15. In Processing 601 shown in FIG. 20, the modified value is input by the data input unit 221 into the apparatus. Receiving the modified value, the controller 228 sets the design parameter P3 on the disk 18 through the design-parameter management unit 223. The design-parameter management unit 223 then notifies the design-consistency management unit 224 of the fact that a design parameter has been modified along with P3, the name of the modified design parameter, through the controller 228. Receiving the notification, the design-parameter auto-correction unit 231 in the design-consistency management unit 224 requests the controller 228 to execute all programs that treats the parameter name P3 as their input value. The controller 228, in turn, requests the program registration unit 227 to read the programs and design parameters required for the execution of the programs from the disk 18 and load them into the main storage device 14 through the disk controller 17, the multibus 11 and the central processing unit 13 for execution. It is obvious from FIG. 26 that an analysis program f1 for computing the wire height P8, an analysis program f3 for computing the parameter P9, and an analysis program f4 for computing the parameter P15, the plastic flow inside the cavity and others which treat the parameter P3 as their input are executed while input parameters required for their execution are being collected one after another. As the execution of the necessary programs is completed, the design-consistency management unit 224 stores their output results, also known as output parameters, into the disk 18 through the design-parameter management unit 223. As a result of the modification of the design parameter P3 pertaining to the structure design section, the parameters P8 and P9 pertaining to the frame design section and the parameter P15 pertaining to the die design section, etc. are also modified automatically. The design-parameter management unit 223 further notifies the design-consistency management unit 224 of the fact that design parameters have been modified along with P8, P9 and P15, the names of the modified design parameters, through the controller 228. Thereafter, a frame-deformation analysis program f5 which requires P15 as its input is executed in the same way as the programs described above. As such, in Processing 602 shown in FIG. 20, parameter correction is repeated in a manner resembling a chained reaction.

At the time a series of corrections of design parameters described above are completed, the constraint check unit 232 inside the design-consistency unit 224 sends an inquiry about the names of modified design parameters and their new values to the design-parameter management unit 223 through the controller 228. In response to the inquiry, the design-parameter management unit 223 transmits the code names P8, P9, P15, P16, etc. of the modified design parameters to the constraint check unit 232 through the controller 228. In Processing 603, the subsequent processing, the constraint check unit 232 reads constraint conditions for the modified design parameters specified by the received code names from the disk 18 through the design-constraint registration unit 226 and compares the value of each design parameter to its corresponding constraint condition. In Processing 604, a design parameter violating its constraint condition is identified. If comparison results indicate that all the modified design parameters satisfy their constraint conditions, the design-consistency management unit 224 requests the controller 228 to end the modification of design parameters. If a design parameter violating its constraint condition is identified, however, the processing procedure continues to Processing 605 in which the difference between the values of the constraints and the design parameter is computed and then output to the display unit 15 through the controller 228 and the output unit 222. For example, assume that the wire height P8 exceeds its limit. As described above, the difference between the wire height and its maximum is output to the display unit 15. At that time, the system enters a wait state temporarily, requesting an instruction from the user. In response to the request, which is issued by the controller 228, the user inputs a modified value of, for example, the frame thickness P4, one of design parameters that have something to do with the wire height P8, or to be more specific, a design parameter that has an effect of decreasing the wire height P8. As an alternative, the user at the frame design section relaxes the constraint condition for the wire height, ignoring the violation by the new value of the wire height. As still another alternative, the constraint conditions of other design parameters related to the wire height P8 are relaxed so as to result in a reduced wire height. The system remains in this wait state, which is denoted by reference numeral 606 in FIG. 20, until the user inputs an instruction to request a study of constraint relaxation that allows related design parameters to be specified. In this case, if the user specifies a modified value of a design parameter that has an effect of reducing the wire height, the frame thickness P8 for example, the processing procedure is repeated, starting with Processing 601 described earlier. Thereafter, a plurality of design sections repeat a joint study of specifications till a design solution, a combination of design parameters that satisfy design constraints, is found. If a design solution is not found by all means, however, it becomes necessary to study constraint relaxation. For example, each design parameter has been set to a value almost equal to its constraint in the above processing. Nevertheless, P9, the distance from the top surface of the package to the wire, exceeds its constraint value. In this case, the user inputs a request for a study of relaxation of constraints for design parameters related to P9 and the parameter name P9 via the keyboard 15 to the data input unit 221. Receiving the request, the constraint-relaxation candidate listing unit 241 in the constraint-relaxation and arrangement unit 225 requests the program registration unit 227 through the controller 228 to read the names of design parameters treated as input items by a program outputting a value of the parameter P9. In response to this request, the program registration unit 227 finds f3 from the disk 18, and transfers the names of parameters input to f3, P1 for the package height, P3 for the distance from the bottom surface of the package to the bottom surface of the frame, P4 for the frame thickness, P5 for the chip thickness and P8 or the wire height, to the constraint-relaxation candidate listing unit 241 through the controller 228. The constraint-relaxation candidate listing unit 241, in turn, requests the design-constraint registration unit 226 through the controller 228 to read constraint conditions and set base data for the parameters P1, P3, P4, P5 and P8 transmitted thereto. In response to the request, the design-constraint registration unit 226 searches the disk 18 for constraint conditions P3>a1, P4>a2, P5>a3 and a6<P8<a7 and set base data names d1, d2, d3 and d6 for P3, P4, P5 and P8 and then transfers them to the constraint-relaxation candidate listing unit 241 through the controller 228. Receiving this information, in Processing 607, the constraint-relaxation candidate listing unit 241 reads pieces of data specified by the names d1, d2, d3 and d6 from the disk 18 and then outputs each piece of the data with its corresponding constraint condition superimposed thereon to the display unit 15 through the controller 228 and the output unit 222 as a list of candidates for constraint relaxation as shown in FIG. 29.

By the way, constraint conditions are generally set by authorized design sections. Therefore, nobody except the person in charge of setting the constraint condition in the design section can determine whether or not the constraint can be relaxed. By displaying a list of constraint conditions in Processing 607 to responsible people assigned to a plurality of design sections at the same time, however, they can identify which design conditions are set with margins with ease and relax the design conditions one after another starting with the one having the largest margin. As a result of the study, the constraint condition, for which the frame design section is responsible, are relaxed from P4>a2 to P4>a2', where a2>a2'. To implement this relaxation, the user interactively changes the constraint condition displayed on the screen by Processing 607 using the keyboard 15. The modified constraint condition is then input to the system by the data input unit 221. Subsequently, the constraint-condition modification unit 242 of the constraint-relaxation and arrangement unit 225 requests the design-constraint registration unit 226 through the controller 228 to store the changed constraint condition. In response to the request, the design-constraint registration unit 226 executes Processing 608 to store the new constraint condition P4>a2' into the disk 18. Since the constraint condition for the frame thickness P4 is relaxed as such, the frame thickness can be set to a smaller value in subsequent processings. As a result, the problem that P9, the distance from the top surface of the package to the wire, exceeds its maximum limit can thereby be solved.

As described above, the embodiment allows all relevant design parameters to be corrected automatically and side effects to be detected quickly by using results of evaluation of a prototype of a semiconductor package when a local design parameter is altered individually by a design section, and in case a design solution satisfying design constraints is not found, a plurality of design sections make a collaborated effort to relax and reassess the design constraints in an attempt to speed up the specification study at the prototyping stage.

It should be noted that a plurality of design sections may be located at geographically diversified areas remote from each other instead of being clustered at a particular site. In this case, apparatuses for managing collaborated design installed individually at the design sections are connected to each other to form a suitable network system such as the LAN. As a result, even if the design sections are installed at different locations to form a distributed system, relevant design parameters can be corrected automatically with ease after a particular parameter is changed.

What is claimed is:

1. A collaborated design management method for supporting a process of determining specifications comprised of design parameters of a product during a design process involving a plurality of design sections or prototyping sections, said method comprising:

a first step of inputting into a computer system design parameters of a product-specification draft including at least external dimensions, materials and manufacturing conditions which are input at each design section with constraint conditions for each design parameter related to said product as well as set base data or empirical data for said constraint conditions, rules governing relations among said design parameters and a set of programs necessary for evaluation of said design parameters registered in advance;

a second step of autonomously correcting all design parameters or setting all design parameters affected by updating of a design parameter or inputting of a new design parameter;

a third step of judging whether values of said corrected design parameters meet said constraint conditions;

a fourth step of computing and displaying to a user a difference between a value of a design parameter and a constraint value in the case of a detected constraint violation by said design parameters;

a fifth step of requesting the user to correct an inputted value of said design parameter or to modify said constraint condition in the case of the detected constraint violation by said design parameter;

a sixth step of creating a list of constraint conditions related to said design parameter which violate said constraint along with set base data of said conditions and displaying said list to the user in case the user has selected an alternative to modify said constraint values;

a seventh step of re-cataloging said displayed constraint conditions after being corrected interactively, whereby all relevant design parameters are corrected automatically through collaboration among a plurality of design sections whenever a local design parameter is changed by an individual design section; and constructing the product in accordance with the corrected relevant design parameters.

2. A computer-assisted collaborated design management system for supporting a process of determining specifications comprised of design parameters of a product during a design process involving a plurality of design sections or prototyping sections, said system comprising:

data input means for inputting into a computer system design parameters of a product-specification draft including at least external dimensions, materials and manufacturing conditions inputted at each of said design sections and prototyping sections;

design-parameter management means for controlling all design parameters for a product in an integrated manner;

design-constraint registration means for cataloging constraint conditions for each design parameter along with set base data for constraint conditions;

program registration means for cataloging rules governing relations among said design parameters or a set of programs required for computing values by said computer system of evaluation functions for said design parameters;

design-consistency management means comprising a function for loading and invoking relevant programs from said program registration means accompanying modification of a design parameter and automatically correcting all design parameters affected by the modification of said design parameter, and a function for checking whether corrected values of said design parameters meet constraint conditions cataloged in said design constraint registration means; and constraint-relaxation and adjustment means comprising a function for listing and displaying constraint conditions in said design-constraint registration means not satisfied by design parameters in question, and a function for interactively correcting said unsatisfied design constraints and recataloging said corrected design constraints into said design-constraint registration means.

3. A computer-assisted collaborated design management network system for supporting determination of specifications comprised of design parameters of a product in a distributed design process involving a plurality of design sections and prototyping sections located at sites remote from each other, said collaborated design/development management network system comprising workstations each installed at one of said design sections and said prototyping sections and connected to each other to form a network, wherein each of said workstations serves as a collaborated design management apparatus comprising at least:

data-input means for inputting design parameters into a computer system of a product-specification draft including at least external dimensions, materials and manufacturing conditions inputted by the user;

design-parameter management means for controlling all design parameters for a product in an integrated manner;

design-constraint registration means for cataloging constraint conditions for each design parameter along with set base data for said constraint conditions;

program registration means or cataloging rules governing relations among said design parameters or a set of programs required for computing values of evaluation functions for said design parameters;

design-consistency management means comprising a function for loading and invoking relevant programs from said program registration means accompanying modification of a design parameter and automatically correcting all design parameters affected by the modification of said design parameter, and a function for checking whether or not corrected values of said design parameters meet constraint conditions cataloged in said design-constraint registration means; and constraint-relaxation and adjustment means comprising a function for listing and displaying constraint conditions in said design-constraint registration means not satisfied by design parameters in question, and a function for interactively correcting said unsatisfied design constraints and recataloging said corrected design constraints into said design-constraint registration means.

4. A method for computer-assisted cooperative design for use by a plurality of design departments in cooperatively determining design specifications of a product having a plurality of design items, said method including a process of supporting computer data input and a process of supporting cooperative design, said process of computer data input comprising the steps of:

(a) inputting into a computer system, via an input unit, the names of the design parameters for determining the design specifications of said product in conjunction with the name of the design department having the right to determine the values of said design parameters as well as the information about whether or not any of the design parameters is associated with a trade-off among a plurality of design evaluation items, the input names and the input information being stored into a design parameter management part of a storage unit of the computer system; and (b) inputting, via said input unit, an analysis program for each of said design evaluation items in conjunction with the design parameters needed to perform said analysis program, the input analysis program and the input design parameters being stored into an analysis program storage part of said storage unit;

said process of supporting cooperative design comprising the steps of:

(c) inputting via said input unit the values of the design parameters which a given design department has the right to determine, together with any design evaluation items needed in conjunction with said design parameters;

(d) storing the input design parameter values into said design parameter management part of said storage unit;

(e) if any design evaluation item was input in the step (c), autonomously retrieving the analysis program corresponding to the input design evaluation item from said analysis program storage part of said storage unit and, if no design evaluation item was input in the step (c), retrieving from said analysis program storage part of said storage unit the analysis program which admits as the input thereof the design parameters previously input in conjunction with the program;

(f) checking said design parameter management part to see if there exist all design parameter values needed to execute the retrieved analysis program and, if any design parameter has yet to take on a value, outputting information requesting temporary determination of a value for the undetermined design parameter onto an output unit of the design department responsible for determining the value of said undetermined design parameter so that the responsible design department supplies a design parameter value, the step (f) being followed by the next step when all design parameters needed to execute said retrieved analysis program have been given values;

(g) checking said design parameter management part to see if there exists, among the design parameters needed to execute said retrieved analysis program, any design parameter associated with a trade-off among a plurality of design evaluation items, executing said retrieved analysis program if no design parameter exists in association with said trade-off and establishing a plurality of candidate design parameter values if any design parameter exists in association with said trade-off, so that said retrieved analysis program is executed on each of said candidate design parameter values;

(h) repeating the steps (f) and (g) for the analysis programs corresponding to all evaluation items, the step (h) being followed by the subsequent steps which are carried out depending on the result of each analysis program having been executed on each of the candidate values of said design parameter associated with said trade-off among said plurality of design evaluation items;

(i) approximating the analyzed result from said analysis program by use of a polynomial of said design parameter;

(j) translating to a normalized function the analyzed result approximated by use of said polynomial, the value of said normalized function being 1 when said analyzed result is the best and 0 when said analyzed result is the worst;

(k) obtaining an evaluation expression by multiplying a variable coefficient the function for all analyzed results acquired in the step (j) and by having the multiplied results added up;

(l) determining as the optimum value of said design parameter the design parameter value maximizing said evaluation expression; and (m) outputting said evaluation expression and said optimum value onto said output unit.

5. The method for computer-assisted cooperative design according to claim 4 wherein, at said step (f) temporarily setting design parameter values, if said responsible design department does not supply the values of said undetermined design parameters, appropriate values are obtained from previously field-proven data for said design parameters.

6. The method for computer-assisted cooperative design according to claim 4 wherein, at step (h), at least one of said all evaluation items is an estimate value of the manufacturing cost.

7. A cooperative design support apparatus for use by a plurality of design means in cooperatively determining design specifications of a product having a plurality of design items, said cooperative design support apparatus comprising:

(a) a design parameter management means for storing either the names or the values of the design parameters for determining the design specifications of said product in conjunction with the name of the design means having the right to determine the values of said design parameters as well as the information about whether any of said design parameters are associated with a trade-off among a plurality of design evaluation items;

(b) an analysis program storage means for storing an analysis program for each of said design evaluation items in conjunction with the design parameters needed to perform said analysis program;

(c) a data input means for inputting the values of the design parameters which a given design means has a right to determine, together with any design evaluation items needed in conjunction with said design parameters;

(d) an analysis execution means whereby, if any design evaluation item was input through said data input means, the analysis program corresponding to the input design evaluation item is retrieved from said analysis program storage means and, if no design evaluation item was input, the analysis program which admits as the input thereof the design parameters previously input in conjunction with the program is retrieved from said analysis program storage means, whereby a check is made to see if there exists all design parameter values needed to execute the retrieved analysis program and, if any design parameter has yet to take on a value, a command is sent to a design parameter temporary determination request means for outputting information requesting temporary determination of a value for the undetermined design parameter onto an output unit of the design means responsible for determining the value of said undetermined design parameter so that the responsible design means supplies a design parameter value, whereby, if all design parameters needed to execute said retrieved analysis program have been given values, a check is made to see if there exists, among the design parameters needed to execute said retrieved analysis program, any design parameter associated with a trade-off among a plurality of design evaluation items, and whereby said retrieved analysis program is executed if no design parameter exists in association with said trade-off, and a plurality of candidate design parameter values are established if any design parameter exists in association with said trade-off, so that said retrieved analysis program is executed on each of said candidate design parameter values;

(e) an analyzed result storage means for storing the analyzed result from said analysis program;

(f) said design parameter temporary determination request means outputting the information requesting temporary determination of a value for any undetermined design parameter;

(g) a trade-off evaluation means for approximating the analyzed result from said analysis program using a polynomial of said design parameter associated with said trade-off among said plurality of design evaluation items, whereby the analyzed result approximated by use of said polynomial is translated into a normalized function, the value of said normalized function being 1 when said analyzed result is the best and 0 when said analyzed result is the worst, whereby an evaluation expression is obtained by multiplying the function for all analyzed results obtained by a variable coefficient and by summing the multiplied results, and whereby the design parameter value maximizing said evaluation expression is determined as the optimum value of said design parameter; and (h) a result display means for outputting said evaluation expression and said optimum value onto said output unit.

8. The apparatus for cooperative design according to claim 7 further comprising workstations, each associated to one of said design items, and buses for connecting said workstations to each other through a communication control means, wherein said workstations may be installed at sites remote from each other.

9. The apparatus for cooperative design according to claim 8 further comprising workstations, each assigned to one of said design items, buses for connecting said workstations to each other through a communication control means and at least one central workstation connected to said buses, wherein each of said workstations assigned to said design items comprises at least data input means, design parameter management means and analysis means, whereas said central workstation includes at least means for performing total evaluation.

* * * * *